United States Patent
Burak et al.

(10) Patent No.: US 9,148,117 B2
(45) Date of Patent: Sep. 29, 2015

(54) COUPLED RESONATOR FILTER COMPRISING A BRIDGE AND FRAME ELEMENTS

(75) Inventors: Dariusz Burak, Fort Collins, CO (US); Alexandre Shirakawa, San Jose, CA (US); Chris Feng, Fort Collins, CO (US); Phil Nikkel, Loveland, CO (US); Stefan Bader, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 968 days.

(21) Appl. No.: 13/167,939

(22) Filed: Jun. 24, 2011

(65) Prior Publication Data

US 2012/0218058 A1  Aug. 30, 2012

Related U.S. Application Data

(63) Continuation-in-part of application No. 13/036,489, filed on Feb. 28, 2011.

(51) Int. Cl.
*H03H 9/54* (2006.01)
*H03H 9/02* (2006.01)
(Continued)

(52) U.S. Cl.
CPC .............. *H03H 9/0211* (2013.01); *H03H 3/04* (2013.01); *H03H 9/132* (2013.01); *H03H 9/584* (2013.01); *H03H 9/587* (2013.01); *H03H 9/589* (2013.01); *H03H 9/02007* (2013.01)

(58) Field of Classification Search
CPC ... H03H 9/02; H03H 9/0211; H03H 9/02086; H03H 9/02118; H03H 9/13; H03H 9/173; H03H 9/175; H03H 9/178; H03H 9/54; H03H 9/564; H03H 9/566; H03H 9/584–9/589; H03H 9/60

USPC .......... 333/187–189; 310/312, 321–324, 334, 310/335, 366

See application file for complete search history.

(56) References Cited

U.S. PATENT DOCUMENTS 3,174,122 A  3/1965 Fowler et al.
3,189,851 A  6/1965 Fowler
(Continued)

FOREIGN PATENT DOCUMENTS

CN  1383611 A  12/2002
CN  1845453 A  10/2006
(Continued)

OTHER PUBLICATIONS

Co-pending U.S. Appl. No. 12/710,640, filed Feb. 23, 2010.
(Continued)

*Primary Examiner* — Barbara Summons

(57) ABSTRACT

In accordance with a representative embodiment, a bulk acoustic wave (BAW) resonator structure, comprises: a first BAW resonator comprising a first lower electrode, a first upper electrode and a first piezoelectric layer disposed between the first lower electrode and the first upper electrode; a second BAW resonator comprising a second lower electrode, a second upper electrode and a second piezoelectric layer disposed between the second lower electrode and the second upper electrode; an acoustic coupling layer disposed between the first BAW resonator and the second BAW resonator; and a bridge disposed between the first lower electrode of the first BAW resonator and the second upper electrode of the second BAW resonator. An inner raised region or an outer raised region, or both are disposed over the second upper electrode.

34 Claims, 7 Drawing Sheets

(51) Int. Cl.
  *H03H 3/04* (2006.01)
  *H03H 9/13* (2006.01)
  *H03H 9/58* (2006.01)

(56) References Cited

U.S. PATENT DOCUMENTS

| | | | |
|---|---|---|---|
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,344,004 A | 8/1982 | Okubo |
| 4,355,408 A | 10/1982 | Scarrott |
| 4,456,850 A | 6/1984 | Inoue et al. |
| 4,529,904 A | 7/1985 | Hattersley |
| 4,608,541 A | 8/1986 | Moriwaki et al. |
| 4,625,138 A | 11/1986 | Ballato |
| 4,640,756 A | 2/1987 | Wang et al. |
| 4,719,383 A | 1/1988 | Wang et al. |
| 4,769,272 A | 9/1988 | Byrne et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | McClanahan et al. |
| 4,906,840 A | 3/1990 | Zdeblick et al. |
| 4,975,892 A | 12/1990 | Defranould et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,166,646 A | 11/1992 | Avanic et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Boloforosh |
| 5,475,351 A | 12/1995 | Uematsu et al. |
| 5,548,189 A | 8/1996 | Williams |
| 5,567,334 A | 10/1996 | Baker et al. |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,704,037 A | 12/1997 | Chen |
| 5,705,877 A | 1/1998 | Shimada |
| 5,714,917 A | 2/1998 | Ella |
| 5,729,008 A | 3/1998 | Blalock et al. |
| 5,789,845 A | 8/1998 | Wadaka et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,903,087 A | 5/1999 | Mattson et al. |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,051,907 A | 4/2000 | Ylilammi |
| 6,060,818 A | 5/2000 | Ruby et al. |
| 6,087,198 A | 7/2000 | Panasik |
| 6,090,687 A | 7/2000 | Merchant et al. |
| 6,107,721 A | 8/2000 | Lakin |
| 6,111,341 A | 8/2000 | Hirama |
| 6,111,480 A | 8/2000 | Iyama et al. |
| 6,114,795 A | 9/2000 | Tajima et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk |
| 6,150,703 A | 11/2000 | Cushman et al. |
| 6,187,513 B1 | 2/2001 | Katakura |
| 6,198,208 B1 | 3/2001 | Yano et al. |
| 6,215,375 B1 | 4/2001 | Larson, III et al. |
| 6,219,032 B1 | 4/2001 | Rosenberg et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,284,121 B1 | 9/2001 | Reid |
| 6,292,336 B1 | 9/2001 | Horng et al. |
| 6,306,755 B1 | 10/2001 | Zheng |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella et al. |
| 6,498,604 B1 | 12/2002 | Jensen |
| 6,507,983 B1 | 1/2003 | Ruby et al. |

(56) References Cited

U.S. PATENT DOCUMENTS

| | | |
|---|---|---|
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |
| 6,559,530 B2 | 5/2003 | Hinzel et al. |
| 6,564,448 B1 | 5/2003 | Oura et al. |
| 6,566,956 B2 | 5/2003 | Ohnishi et al. |
| 6,566,979 B2 | 5/2003 | Larson, III et al. |
| 6,580,159 B1 | 6/2003 | Fusaro et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |
| 6,601,276 B2 | 8/2003 | Barber |
| 6,603,182 B1 | 8/2003 | Low et al. |
| 6,617,249 B2 | 9/2003 | Ruby et al. |
| 6,617,750 B2 | 9/2003 | Dummermuth et al. |
| 6,617,751 B2 | 9/2003 | Sunwoo et al. |
| 6,621,137 B1 | 9/2003 | Ma et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson, III et al. |
| 6,657,363 B1 | 12/2003 | Aigner |
| 6,668,618 B2 | 12/2003 | Larson, III et al. |
| 6,670,866 B2 | 12/2003 | Ella et al. |
| 6,677,929 B2 | 1/2004 | Gordon et al. |
| 6,693,500 B2 | 2/2004 | Yang et al. |
| 6,709,776 B2 | 3/2004 | Noguchi et al. |
| 6,710,508 B2 | 3/2004 | Ruby et al. |
| 6,710,681 B2 | 3/2004 | Figueredo et al. |
| 6,713,314 B2 | 3/2004 | Wong et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Plazza et al. |
| 6,738,267 B1 | 5/2004 | Navas Sabater et al. |
| 6,750,593 B2 | 6/2004 | Iwata |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 | 11/2004 | Kaitila et al. |
| 6,820,469 B1 | 11/2004 | Adkins et al. |
| 6,828,713 B2 | 12/2004 | Bradley et al. |
| 6,842,088 B2 | 1/2005 | Yamada et al. |
| 6,842,089 B2 | 1/2005 | Lee |
| 6,849,475 B2 | 2/2005 | Kim |
| 6,853,534 B2 | 2/2005 | Williams |
| 6,861,920 B2 | 3/2005 | Ishikawa et al. |
| 6,872,931 B2 | 3/2005 | Liess et al. |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,837 B2 | 8/2005 | Yamada et al. |
| 6,936,928 B2 | 8/2005 | Hedler et al. |
| 6,936,954 B2 | 8/2005 | Peczalski |
| 6,941,036 B2 | 9/2005 | Lucero |
| 6,943,647 B2 | 9/2005 | Aigner |
| 6,943,648 B2 | 9/2005 | Maiz et al. |
| 6,946,928 B2 | 9/2005 | Larson, III et al. |
| 6,954,121 B2 | 10/2005 | Bradley et al. |
| 6,963,257 B2 | 11/2005 | Ella et al. |
| 6,970,365 B2 | 11/2005 | Turchi |
| 6,975,183 B2 | 12/2005 | Aigner et al. |
| 6,977,563 B2 | 12/2005 | Komuro et al. |
| 6,985,051 B2 | 1/2006 | Nguyen et al. |
| 6,985,052 B2 | 1/2006 | Tikka |
| 6,987,433 B2 | 1/2006 | Larson, III et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson, III |
| 7,026,876 B1 | 4/2006 | Esfandiari et al. |
| 7,053,456 B2 | 5/2006 | Matsuo |
| 7,057,476 B2 | 6/2006 | Hwu |
| 7,057,478 B2 | 6/2006 | Korden et al. |
| 7,064,606 B2 | 6/2006 | Louis |
| 7,084,553 B2 | 8/2006 | Ludwiczak |
| 7,091,649 B2 | 8/2006 | Larson, III et al. |
| 7,098,758 B2 | 8/2006 | Wang et al. |
| 7,102,460 B2 | 9/2006 | Schmidhammer et al. |
| 7,109,826 B2 | 9/2006 | Ginsburg et al. |
| 7,128,941 B2 | 10/2006 | Lee |
| 7,129,806 B2 | 10/2006 | Sato |
| 7,138,889 B2 | 11/2006 | Lakin |
| 7,148,466 B2 | 12/2006 | Eckman et al. |
| 7,158,659 B2 | 1/2007 | Baharav et al. |
| 7,161,448 B2 | 1/2007 | Feng et al. |
| 7,170,215 B2 | 1/2007 | Namba et al. |
| 7,173,504 B2 | 2/2007 | Larson, III et al. |
| 7,179,392 B2 | 2/2007 | Robert et al. |
| 7,187,254 B2 | 3/2007 | Su et al. |
| 7,199,683 B2 | 4/2007 | Thalhammer |
| 7,209,374 B2 | 4/2007 | Noro |
| 7,212,083 B2 | 5/2007 | Inoue et al. |
| 7,212,085 B2 | 5/2007 | Wu |
| 7,230,509 B2 | 6/2007 | Stoemmer |
| 7,230,511 B2 | 6/2007 | Onishi et al. |
| 7,233,218 B2 | 6/2007 | Park et al. |
| 7,235,915 B2 | 6/2007 | Nakamura et al. |
| 7,242,270 B2 | 7/2007 | Larson, III et al. |
| 7,259,498 B2 | 8/2007 | Nakatsuka et al. |
| 7,268,647 B2 | 9/2007 | Sano et al. |
| 7,275,292 B2 | 10/2007 | Ruby et al. |
| 7,276,994 B2 | 10/2007 | Takeuchi et al. |
| 7,280,007 B2 | 10/2007 | Feng et al. |
| 7,281,304 B2 | 10/2007 | Kim et al. |
| 7,294,919 B2 | 11/2007 | Bai |
| 7,301,258 B2 | 11/2007 | Tanaka |
| 7,310,861 B2 | 12/2007 | Aigner et al. |
| 7,313,255 B2 | 12/2007 | Machida et al. |
| 7,332,985 B2 | 2/2008 | Larson, III et al. |
| 7,345,410 B2 | 3/2008 | Grannen et al. |
| 7,358,831 B2 | 4/2008 | Larson et al. |
| 7,367,095 B2 | 5/2008 | Larson, III et al. |
| 7,368,857 B2 | 5/2008 | Tanaka |
| 7,369,013 B2 | 5/2008 | Fazzio et al. |
| 7,385,467 B2 | 6/2008 | Stoemmer et al. |
| 7,388,318 B2 | 6/2008 | Yamada et al. |
| 7,388,454 B2 | 6/2008 | Ruby et al. |
| 7,388,455 B2 | 6/2008 | Larson, III |
| 7,391,286 B2 | 6/2008 | Jamneala et al. |
| 7,400,217 B2 | 7/2008 | Larson, III et al. |
| 7,408,428 B2 | 8/2008 | Larson, III |
| 7,414,349 B2 | 8/2008 | Sasaki |
| 7,414,495 B2 | 8/2008 | Iwasaki et al. |
| 7,420,320 B2 | 9/2008 | Sano et al. |
| 7,423,503 B2 | 9/2008 | Larson, III et al. |
| 7,425,787 B2 | 9/2008 | Larson, III |
| 7,439,824 B2 | 10/2008 | Aigner |
| 7,463,118 B2 | 12/2008 | Jacobsen |
| 7,466,213 B2 | 12/2008 | Lobl et al. |

(56) References Cited

U.S. PATENT DOCUMENTS

| | | |
|---|---|---|
| 7,468,608 B2 | 12/2008 | Feucht et al. |
| 7,482,737 B2 | 1/2009 | Yamada et al. |
| 7,508,286 B2 | 3/2009 | Ruby et al. |
| 7,515,018 B2 | 4/2009 | Handtmann et al. |
| 7,535,154 B2 * | 5/2009 | Umeda et al. ............ 310/320 |
| 7,535,324 B2 | 5/2009 | Fattinger et al. |
| 7,545,532 B2 | 6/2009 | Muramoto |
| 7,561,009 B2 | 7/2009 | Larson, III et al. |
| 7,567,023 B2 | 7/2009 | Iwaki et al. |
| 7,576,471 B1 | 8/2009 | Solal |
| 7,602,101 B2 | 10/2009 | Hara et al. |
| 7,602,102 B1 | 10/2009 | Barber et al. |
| 7,616,079 B2 | 11/2009 | Tikka et al. |
| 7,619,493 B2 | 11/2009 | Uno et al. |
| 7,629,865 B2 | 12/2009 | Ruby |
| 7,636,026 B2 | 12/2009 | Heinze et al. |
| 7,649,304 B2 | 1/2010 | Umeda et al. |
| 7,655,963 B2 | 2/2010 | Sadaka et al. |
| 7,684,109 B2 | 3/2010 | Godshalk et al. |
| 7,714,684 B2 | 5/2010 | Ruby et al. |
| 7,737,807 B2 | 6/2010 | Larson et al. |
| 7,758,979 B2 | 7/2010 | Akiyama et al. |
| 7,768,364 B2 | 8/2010 | Hart et al. |
| 7,791,434 B2 | 9/2010 | Fazzio et al. |
| 7,795,781 B2 | 9/2010 | Barber et al. |
| 7,869,187 B2 | 1/2011 | McKinzie et al. |
| 7,889,024 B2 | 2/2011 | Bradley et al. |
| 7,966,722 B2 | 6/2011 | Hart et al. |
| 7,978,025 B2 | 7/2011 | Yokoama et al. |
| 8,008,993 B2 | 8/2011 | Milsom et al. |
| 8,030,823 B2 | 10/2011 | Sinha et al. |
| 8,084,919 B2 | 12/2011 | Nishihara et al. |
| 8,188,810 B2 | 5/2012 | Fazzio et al. |
| 8,222,795 B2 | 7/2012 | Sinha et al. |
| 8,230,562 B2 | 7/2012 | Fazzio et al. |
| 8,248,185 B2 | 8/2012 | Choy et al. |
| 8,253,513 B2 | 8/2012 | Zhang |
| 8,384,497 B2 | 2/2013 | Zhang |
| 8,456,257 B1 | 6/2013 | Fattinger |
| 8,575,820 B2 * | 11/2013 | Shirakawa et al. ............ 310/320 |
| 8,692,631 B2 | 4/2014 | Zhang |
| 8,902,023 B2 | 12/2014 | Choy et al. |
| 2001/0045793 A1 | 11/2001 | Misu et al. |
| 2002/0000646 A1 | 1/2002 | Gooch et al. |
| 2002/0030424 A1 | 3/2002 | Iwata |
| 2002/0063497 A1 | 5/2002 | Panasik |
| 2002/0070463 A1 | 6/2002 | Chang et al. |
| 2002/0121944 A1 | 9/2002 | Larson, III et al. |
| 2002/0121945 A1 | 9/2002 | Ruby et al. |
| 2002/0126517 A1 | 9/2002 | Matsukawa et al. |
| 2002/0140520 A1 | 10/2002 | Hikita et al. |
| 2002/0152803 A1 | 10/2002 | Larson, III et al. |
| 2002/0153965 A1 | 10/2002 | Ruby et al. |
| 2002/0158716 A1 | 10/2002 | Pensala |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0011285 A1 | 1/2003 | Ossmann |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |
| 2003/0179053 A1 | 9/2003 | Aigner et al. |
| 2003/0193269 A1 | 10/2003 | Jang et al. |
| 2003/0205948 A1 | 11/2003 | Lin et al. |
| 2003/0227357 A1 | 12/2003 | Metzger et al. |
| 2004/0016995 A1 | 1/2004 | Kuo et al. |
| 2004/0017130 A1 | 1/2004 | Wang et al. |
| 2004/0027216 A1 | 2/2004 | Ma et al. |
| 2004/0056735 A1 | 3/2004 | Nomura et al. |
| 2004/0092234 A1 | 5/2004 | Pohjonen |
| 2004/0099898 A1 | 5/2004 | Grivna et al. |
| 2004/0124952 A1 | 7/2004 | Tikka |
| 2004/0129079 A1 | 7/2004 | Kato et al. |
| 2004/0150293 A1 | 8/2004 | Unterberger |
| 2004/0150296 A1 | 8/2004 | Park et al. |
| 2004/0166603 A1 | 8/2004 | Carley |
| 2004/0195937 A1 | 10/2004 | Matsubara et al. |
| 2004/0212458 A1 | 10/2004 | Lee |
| 2004/0246075 A1 | 12/2004 | Bradley et al. |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0012716 A1 | 1/2005 | Mikulin et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0093396 A1 | 5/2005 | Larson, III et al. |
| 2005/0093397 A1 | 5/2005 | Yamada et al. |
| 2005/0093653 A1 | 5/2005 | Larson, III |
| 2005/0093654 A1 | 5/2005 | Larson, III et al. |
| 2005/0093655 A1 | 5/2005 | Larson, III et al. |
| 2005/0093657 A1 | 5/2005 | Larson, III et al. |
| 2005/0093658 A1 | 5/2005 | Larson, III et al. |
| 2005/0093659 A1 | 5/2005 | Larson, III et al. |
| 2005/0104690 A1 | 5/2005 | Larson, III et al. |
| 2005/0110598 A1 | 5/2005 | Larson, III |
| 2005/0128030 A1 | 6/2005 | Larson, III et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206479 A1 | 9/2005 | Nguyen et al. |
| 2005/0206483 A1 | 9/2005 | Pashby et al. |
| 2005/0218488 A1 | 10/2005 | Matsuo |
| 2005/0248232 A1 | 11/2005 | Itaya et al. |
| 2005/0269904 A1 | 12/2005 | Oka |
| 2005/0275486 A1 | 12/2005 | Feng |
| 2006/0017352 A1 | 1/2006 | Tanielian |
| 2006/0038636 A1 | 2/2006 | Tsurumi et al. |
| 2006/0071736 A1 | 4/2006 | Ruby et al. |
| 2006/0081048 A1 | 4/2006 | Mikado et al. |
| 2006/0087199 A1 | 4/2006 | Larson, III et al. |
| 2006/0103492 A1 | 5/2006 | Feng et al. |
| 2006/0114541 A1 | 6/2006 | Van Beek |
| 2006/0119453 A1 | 6/2006 | Fattinger et al. |
| 2006/0125489 A1 | 6/2006 | Feucht et al. |
| 2006/0132262 A1 | 6/2006 | Fazzio et al. |
| 2006/0164183 A1 | 7/2006 | Tikka et al. |
| 2006/0164186 A1 | 7/2006 | Stoemer et al. |
| 2006/0176126 A1 | 8/2006 | Wang et al. |
| 2006/0185139 A1 | 8/2006 | Larson, III et al. |
| 2006/0197411 A1 | 9/2006 | Hoen et al. |
| 2006/0226932 A1 | 10/2006 | Fazzio et al. |
| 2006/0238070 A1 | 10/2006 | Costa et al. |
| 2006/0284706 A1 | 12/2006 | Ginsburg et al. |
| 2006/0284707 A1 | 12/2006 | Larson, III et al. |
| 2006/0290446 A1 | 12/2006 | Aigner et al. |
| 2007/0035364 A1 | 2/2007 | Sridhar et al. |
| 2007/0037311 A1 | 2/2007 | Izumi et al. |
| 2007/0080759 A1 | 4/2007 | Jamneala et al. |
| 2007/0085447 A1 | 4/2007 | Larson, III |
| 2007/0085631 A1 | 4/2007 | Larson, III et al. |
| 2007/0085632 A1 | 4/2007 | Larson, III et al. |
| 2007/0086080 A1 | 4/2007 | Larson, III et al. |
| 2007/0086274 A1 | 4/2007 | Nishimura et al. |
| 2007/0090892 A1 | 4/2007 | Larson, III |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2007/0279153 A1 | 12/2007 | Ruby |
| 2007/0291164 A1 | 12/2007 | Goh et al. |
| 2008/0055020 A1 | 3/2008 | Handtmann et al. |
| 2008/0129414 A1 | 6/2008 | Lobl et al. |

(56) References Cited

U.S. PATENT DOCUMENTS

| | | | |
|---|---|---|---|
| 2008/0129417 A1 | 6/2008 | Taniguchi | |
| 2008/0143215 A1 | 6/2008 | Hara et al. | |
| 2008/0258842 A1 | 10/2008 | Ruby et al. | |
| 2008/0297278 A1 | 12/2008 | Handtmann et al. | |
| 2008/0297279 A1 | 12/2008 | Thalhammer et al. | |
| 2008/0297280 A1 | 12/2008 | Thalhammer et al. | |
| 2009/0001848 A1 | 1/2009 | Umeda et al. | |
| 2009/0064498 A1 | 3/2009 | Mok et al. | |
| 2009/0079302 A1 | 3/2009 | Wall et al. | |
| 2009/0096550 A1 | 4/2009 | Handtmann et al. | |
| 2009/0102319 A1 | 4/2009 | Nakatsuka et al. | |
| 2009/0127978 A1 | 5/2009 | Asai et al. | |
| 2009/0153268 A1 | 6/2009 | Milsom et al. | |
| 2009/0201594 A1 | 8/2009 | Smith | |
| 2009/0267453 A1 | 10/2009 | Barber et al. | |
| 2009/0267457 A1 | 10/2009 | Barber et al. | |
| 2010/0013573 A1 | 1/2010 | Umeda | |
| 2010/0033063 A1 | 2/2010 | Nishihara et al. | |
| 2010/0039000 A1 | 2/2010 | Milson et al. | |
| 2010/0052176 A1 | 3/2010 | Kamada et al. | |
| 2010/0052815 A1 | 3/2010 | Bradley et al. | |
| 2010/0091370 A1 | 4/2010 | Mahrt et al. | |
| 2010/0102358 A1 | 4/2010 | Lanzieri et al. | |
| 2010/0107389 A1 | 5/2010 | Nessler et al. | |
| 2010/0148637 A1 | 6/2010 | Satou | |
| 2010/0176899 A1 | 7/2010 | Schaufele et al. | |
| 2010/0187948 A1 | 7/2010 | Sinha et al. | |
| 2010/0187949 A1 | 7/2010 | Pahl et al. | |
| 2010/0260453 A1 | 10/2010 | Block | |
| 2010/0327697 A1 | 12/2010 | Choy et al. | |
| 2010/0327994 A1 | 12/2010 | Choy et al. | |
| 2011/0084779 A1 | 4/2011 | Zhang | |
| 2011/0121689 A1 | 5/2011 | Grannen et al. | |
| 2011/0121916 A1 | 5/2011 | Barber et al. | |
| 2011/0148547 A1 | 6/2011 | Zhang | |
| 2011/0180391 A1 | 7/2011 | Larson, Iii et al. | |
| 2011/0204996 A1 | 8/2011 | Gilbert et al. | |
| 2011/0204997 A1 | 8/2011 | Elbrecht et al. | |
| 2011/0266925 A1 | 11/2011 | Ruby et al. | |
| 2012/0154074 A1 | 6/2012 | Ruby et al. | |
| 2012/0161902 A1 | 6/2012 | Feng et al. | |
| 2012/0177816 A1 | 7/2012 | Larson et al. | |
| 2012/0194297 A1 | 8/2012 | Choy et al. | |
| 2012/0218055 A1* | 8/2012 | Burak et al. | 333/187 |
| 2012/0218056 A1 | 8/2012 | Burak | |
| 2012/0218057 A1 | 8/2012 | Burak et al. | |
| 2012/0218058 A1 | 8/2012 | Burak et al. | |
| 2012/0218059 A1 | 8/2012 | Burak et al. | |
| 2012/0218060 A1 | 8/2012 | Burak et al. | |
| 2012/0226807 A1 | 9/2012 | Panella et al. | |
| 2012/0248941 A1 | 10/2012 | Shirakawa et al. | |
| 2012/0280767 A1 | 11/2012 | Burak et al. | |
| 2013/0038408 A1 | 2/2013 | Burak et al. | |
| 2013/0063227 A1 | 3/2013 | Burak et al. | |
| 2013/0082799 A1 | 4/2013 | Zuo et al. | |
| 2013/0106534 A1 | 5/2013 | Burak et al. | |
| 2013/0127300 A1 | 5/2013 | Umeda et al. | |
| 2013/0140959 A1 | 6/2013 | Shin et al. | |
| 2013/0205586 A1 | 8/2013 | Takada et al. | |
| 2013/0235001 A1 | 9/2013 | Yun et al. | |
| 2013/0241673 A1 | 9/2013 | Yokoyama et al. | |
| 2014/0111288 A1 | 4/2014 | Nikkei et al. | |
| 2014/0118088 A1 | 5/2014 | Burak et al. | |
| 2014/0118090 A1 | 5/2014 | Grannen et al. | |
| 2014/0118091 A1 | 5/2014 | Burak et al. | |
| 2014/0118092 A1 | 5/2014 | Burak et al. | |
| 2014/0132117 A1 | 5/2014 | Larson et al. | |
| 2014/0354109 A1 | 12/2014 | Grannen et al. | |

FOREIGN PATENT DOCUMENTS

| | | |
|---|---|---|
| CN | 101170303 | 4/2008 |
| CN | 101645699 A | 2/2010 |
| CN | 101931380 A | 12/2010 |
| DE | 10160617 | 6/2003 |
| DE | 10239317 | 3/2004 |
| DE | 102007012384 | 9/2008 |
| EP | 231892 | 8/1987 |
| EP | 0637875 | 2/1995 |
| EP | 689254 | 12/1995 |
| EP | 0865157 | 9/1998 |
| EP | 880227 | 11/1998 |
| EP | 1047189 | 10/2000 |
| EP | 1096259 | 5/2001 |
| EP | 1100196 | 5/2001 |
| EP | 1180494 | 2/2002 |
| EP | 1249932 | 10/2002 |
| EP | 1258989 | 11/2002 |
| EP | 1258990 | 11/2002 |
| EP | 1517443 | 3/2005 |
| EP | 1517444 | 3/2005 |
| EP | 1528674 | 5/2005 |
| EP | 1528675 | 5/2005 |
| EP | 1528676 | 5/2005 |
| EP | 1528677 | 5/2005 |
| EP | 1542362 | 6/2005 |
| EP | 1557945 | 7/2005 |
| EP | 1575165 | 9/2005 |
| EP | 0973256 | 9/2006 |
| EP | 2299592 | 3/2011 |
| EP | 2299593 | 3/2011 |
| FR | 2951027 | 4/2011 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 59023612 | 2/1984 |
| JP | 61054686 | 3/1986 |
| JP | 6165507 | 4/1986 |
| JP | 62-109419 | 5/1987 |
| JP | 62-200813 | 9/1987 |
| JP | 1157108 | 6/1989 |
| JP | 1-295512 | 11/1989 |
| JP | 2-10907 | 1/1990 |
| JP | 06005944 | 1/1994 |
| JP | 8-330878 | 12/1996 |
| JP | 09-027729 | 1/1997 |
| JP | 9-83029 | 3/1997 |
| JP | 10-32456 | 2/1998 |
| JP | 2000-31552 | 1/2000 |
| JP | 2000-076295 | 3/2000 |
| JP | 2000-232334 | 8/2000 |
| JP | 2000-295065 | 10/2000 |
| JP | 2000-332568 | 11/2000 |
| JP | 2001-102901 | 4/2001 |
| JP | 2001-508630 | 6/2001 |
| JP | 2002217676 | 8/2002 |
| JP | 2003/017964 | 1/2003 |
| JP | 2003-17974 | 1/2003 |
| JP | 2003-505905 | 2/2003 |
| JP | 2003-505906 | 2/2003 |
| JP | 2003124779 | 4/2003 |
| JP | 2003-332872 | 11/2003 |
| JP | 2006-109472 | 4/2006 |
| JP | 2006186412 | 7/2006 |
| JP | 2006-295924 | 10/2006 |
| JP | 2006-319796 | 11/2006 |
| JP | 2007-006501 | 1/2007 |
| JP | 2007/028669 | 2/2007 |
| JP | 2007-208845 | 8/2007 |
| JP | 2007-295306 | 11/2007 |
| JP | 2008066792 | 3/2008 |
| JP | 2008-131194 * | 6/2008 |
| JP | 2008-211394 | 9/2008 |
| WO | WO-98/16957 | 4/1998 |
| WO | WO-98/38736 | 9/1998 |
| WO | WO-98/56049 | 12/1998 |
| WO | WO-99/37023 | 7/1999 |
| WO | WO-01/06646 | 1/2001 |
| WO | WO-01/06647 | 1/2001 |
| WO | WO-0199276 | 12/2001 |
| WO | WO-02/103900 | 12/2002 |

(56) References Cited

FOREIGN PATENT DOCUMENTS

| WO | WO-03/030358 | 4/2003 |
|---|---|---|
| WO | WO-03/043188 | 5/2003 |
| WO | WO-03/050950 | 6/2003 |
| WO | WO-03/058809 | 7/2003 |
| WO | WO-2004/034579 | 4/2004 |
| WO | WO-2004/051744 | 6/2004 |
| WO | WO-2004/102688 | 11/2004 |
| WO | WO-2005/043752 | 5/2005 |
| WO | WO-2005/043753 | 5/2005 |
| WO | WO-2005/043756 | 5/2005 |
| WO | WO-2006/018788 | 2/2006 |
| WO | WO2006079353 | 8/2006 |
| WO | WO2013065488 | 5/2013 |

OTHER PUBLICATIONS

Co-pending U.S. Appl. No. 13/074,094, filed Mar. 29, 2011.
Martinez, et al. "High confinement suspended micro-ring resonators in silicon-on-insulator," Optics Express, vol. 14, No. 13, Jun. 26, 2006, pp. 6259-6263.
U.S. Appl. No. 10/971,169, filed Oct. 22, 2004, Larson III, John D., et al.
Akiyama, et al., "Enhancement of Piezoelectric Response in Scandium Aluminum Nitride Alloy Thin Films Prepared by Dual Reactive Cosputtering", *Adv. Mater* 2009 , 593-596.
Al-Ahmad, M. et al., "Piezoelectric-Based Tunable Microstrip Shunt Resonator", *Proceedings of Asia-Pacific Microwave Conference* 2006.
Aoyama, Takayuki et al., "Diffusion of Boron, Phosphorous, Arsenic and Antimony in Thermally Grown SiliconDioxide", *Journal of the Electrochemical Society*, vol. 146, No. 5 1999 , 1879-1883.
Auld, B. A. , "Acoustic Resonators", *Acoustic Fields and Waves in Solids, Second Edition*, vol. II 1990 , 250-259.
Bauer, L. O. et al., "Properties of Silicon Implanted with Boron Ions through Thermal Silicon Dioxide", *Solid State Electronics*, vol. 16, No. 3 Mar. 1973 , 289-300.
Bi, F.Z. , "Bulk Acoustic Wave RF Technology", *IEEE Microwave Magazine*, vol. 9, Issue 5. 2008 , 65-80.
Chen, , "Fabrication and Characterization of ALN Thin Film Bulk Acoustic Wave Resonator", *Dissertation, University of Pittsburgh School of Engineering* 2006.
Choi, Sungjin et al., "Design of Half-Bridge Piezo-Transformer Converters in the AC Adapter Applications", *APEC 2005, IEEE* Mar. 2005 , 244-248.
Coombs, Clyde F. , "Electronic Instrument Handbook", *Second Edition, McGraw-Hill, Inc.* 1995 , pp. 5.1 to 5.29.
C-S Lee, et al., "Copper-Airbridged Low-Noise GaAs PHEMT With Ti/WN$_x$/Ti Diffusion Barrier for High-Frequency", *IEEE Transactions on Electron Devices*, vol. 53 , Issue: 8. 2006 , 1753-1758.
Denisse, C.M.M. et al., "Plasma-Enhanced Growth and Composition of Silicon Oxynitride Films", *J. Appl. Phys.*, vol. 60, No. 7. Oct. 1, 1986 , 2536-2542.
Fattinger, G. G. et al., "Coupled Bulk Acoustic Wave Resonator Filters: Key technology for single-to-balanced RF filters", 0-7803-8331-1/4/W20.00; *IEEE MTT-S Digest* 2004 , 927-929.
Fattinger, G.G. et al., "Single-To-Balance Filters for Mobile Phones Using Coupled Resonator BAW Technology", *2004 IEEE Ultrasonics Symposium* Aug. 2004 , 416-419.
Fattinger, G. B. et al., "Spurious Mode Suppression in Coupled Resonator Filters", *IEEE MTT-S International Microwave Symposium Digest* 2005 , 409-412.
Gilbert, S. R. , "An Ultra-Miniature, Low Cost Single Ended to Differential Filter for ISM Band Applications", *Micro. Symp. Digest, 2008 IEEE MTT-S* Jun. 2008 , 839-842.
Grill, A. et al., "Ultralow-K Dielectrics Prepared by Plasma-Enhanced Chemical Vapor Deposition", *App. Phys. Lett*, vol. 79 2001 , 803-805.
Hadimioglu, B. et al., ""Polymer Films as Acoustic Matching Layers".", *1990 IEEE Ultrasonics Symposium Proceedings*, vol. 3 PP. [Previously submitted as "Polymer Files as Acoustic Matching Layers, 1990 IEEE Ultrasonics Symposium Proceeding. vol. 4 pp. 1227-1340, Dec. 1990". Considered by Examiner on Mar. 20, 2007 Dec. 1990 , 1337-1340.
Hara, K. , "Surface Treatment of Quartz Oscillator Plate by Ion Implantation", *Oyo Buturi*, vol. 47, No. 2 Feb. 1978 , 145-146.
Holzlohner, Ronald et al., "Accurate Calculation of Eye Diagrams and Bit Error Rates in Optical Transmission Systems Using Linearization", *Journal of Lightwave Technology*, vol. 20, No. 3, Mar. 2002, pp. 389-400.
Ivensky, Gregory et al., "A Comparison of Piezoelectric Transformer AC/DC Converters with Current Doubler and voltage Doubler Rectifiers", *IEEE Transactions on Power Electronics*, vol. 19, No. 6, Nov. 2004.
Jamneala, T. et al., "Coupled Resonator Filter with Single-Layer Acoustic Coupler", *IEEE Transaction on Ultrasonics, Ferroelectrics, and Frequency Control*, vol. 55 Oct. 2008 , 2320-2326.
Jamneala, Tiberiu et al., "Ultra-Miniature Coupled Resonator Filter with Single-Layer Acoustic Coupler", *IEEE Transactions on Ultrasonics, Ferroelectrics, and Frequency Control*, vol. 56, No. 11. Nov. 2009 , 2553-2558.
Jiang, Yimin et al., "A Novel Single-Phase Power Factor Correction Scheme", *IEEE* 1993 , 287-292.
Jung, Jun-Phil et al., "Experimental and Theoretical Investigation on the Relationship Between AlN Properties and AlN-Based FBAR Characteristics", *2003 IEEE International Frequency Control Symposium and PDA Exhibition Jointly with the 17th European Frequency and Time Forum* Sep. 3, 2003 , 779-784.
Kaitila, J. et al., "Measurement of Acoustical Parameters of Thin Films", *2006 IEEE Ultrasonics Symposium* Oct. 2006 , 464-467.
Krishnaswamy, S.V. et al., "Film Bulk Acoustic Wave Resonator Technology", May 29, 1990 , 529-536.
Lakin, K.M. , "Bulk Acoustic Wave Coupled Resonator Filters", *2002 IEEE International Frequency Control Symposium and PDA Exhibition* May 2002 , 8-14.
Lakin, K.M. , "Coupled Resonator Filters", *2002 IEEE Ultrasonics Symposium* Mar. 2, 2002 , 901-908.
Lakin, K.M. et al., "High Performance Stacked Crystal Filters for GPS and Wide Bandwidth Applications", *2001 IEEE Ultrasonics Symposium* Jan. 1, 2001, 833-838.
Lakin, K. M. et al., "Temperature Compensated Bulk Acoustic Thin Film Resonators", *IEEE Ultrasonics Symposium*, San Juan, Puerto Rico Oct. 2000, 855-858.
Lakin, K.M. , "Thin Film BAW Filters for Wide Bandwidth and High Performance Applications", *IEEE Microwave Symposium Digest*; vol. 2 Jun. 6-11, 2004, 923-926.
Lakin, K. M. , "Thin Film Resonators and Filters", *IEEE Untrasonics Symposium*, Caesar's Tahoe, NV Oct. 1999, 895-906.
Lakin, et al., "Wide Bandwidth Thin Film BAW Filters", *2004 IEEE Ultrasonics Symposium*, vol. 1, Aug. 2004, 407-410.
Larson III, John D. et al., "Measurement of Effective Kt2,Q,Rp,Rs vs. Temperature for Mo/AlN FBAR Resonators", *IEEE Ultrasonics Symposium* 2002, 939-943.
Lee, Jiunn-Homg et al., "Optimization of Frame-Like Film Bulk Acoustic Resonators for Suppression of Spurious Lateral Modes Using Finite Element Method", *IEEE Ultrasonic Symposium*, vol. 1, 2004, 278-281.
Li, Yunxiu et al., "AC-DC Converter with Worldwide Range Input Voltage by Series and Parallel Piezoelectric Transformer Connection", *35th Annual IEEE Power Electronics Specialists Conference* 2004.
Lobl, H.P. et al., "Piezoelectric Materials for BAW Resonators and Filters", *2001 IEEE Ultrasonics Symposium* Jan. 1, 2001, 807-811.
Loboda, M. J. , "New Solutions for Intermetal Dielectrics Using Trimethylsilane-Based PECVD Processes", *Microelectronics Eng.*, vol. 50. 2000, 15-23.
Martin, Steven J. et al., "Development of a Low Dielectric Constant Polymer for the Fabrication of Integrated Circuit Interconnect", *12 Advanced Materials* Dec. 23, 2000, 1769-1778.
Martin, et al., "Re-growth of C-Axis Oriented AlN Thin Films", *IEEE Ultrasonics Symposium* 2006, 169-172.

(56) References Cited

OTHER PUBLICATIONS

Martin, et al., "Shear Mode Coupling and Tilted Gram Growth of AlN Thin Films in BAW Resonators", *IEEE Transactions on Ultrasonics, Ferroelectrics, and Frequency Control*, vol. 53, No. 7 Jul. 2006, 1339-1343.
Martinez, et al., "High confinement suspended micro-ring resonators in silicon-on-insulator", *Optics Express*, Vo. 14, No. 13 Jun. 26, 2006, 6259-6263.
Merriam-Webster, , "Collegiate Dictionary", *tenth edition* 2000, 2 pages.
Navas, J. et al., "Miniaturised Battery Charger using Piezoelectric Transformers", *IEEE* 2001, 492-496.
Ng, J. et al., "The Diffusion Ion-Implanted Boron in Silicon Dioxide", *AIP Conf. Proceedings*, No. 122 1984, 20-33.
Ohta, S. et al., "Temperature Characteristics of Solidly Mounted Piezoelectric Thin Film Resonators", *IEEE Ultrasonics Symposium*, Honolulu, HI Oct. 2003, 2011-2015.
Pandey, et al., "Anchor Loss Reduction in Resonant MEMS using MESA Structures", *Proceedings of the 2nd IEEE International Conference on Nano/Micro Engineered and Molecular Systems*, Bangkok, Thailand Jan. 16-19, 2007, 880-885.
Pang, W. et al., "High Q Single-Mode High-Tone Bulk Acoustic Resonator Integrated With Surface-Machined FBAR Filter", *Microwave Symposium Digest, IEEE MTT-S International* 2005, 413-416.
Parker, T. E. et al., "Temperature-Compensated Surface Acoustic-Wave Devices with SiO2 Film Overlays", *J. Appl. Physics*, vol. 50 1360-1369, Mar. 1979.
Pensala, et al., "Spurious resonance supression in gigahertz-range ZnO thin-film bulk acoustic wave resonators by the boundary frame method: modeling and experiment", *IEEE Transactions on Ultrasonics, Ferroelectrics, and Frequency Control*, vol. 56, No. 8 Aug. 2009, 1731-1744.
Pensala, , "Thin film bulk acoustic wave devices: performance optimization and modeling", http://www.vtt.fi/inf/pdf/publications/2011/P756.pdf.
Reinhardt, Alexandre et al., "Design of Coupled Resonator Filters Using Admittance and Scattering Matrices", *2003 IEEE Ultrasonics Symposium* May 3, 2003, 1428-1431.
Ruby, R. C. , "MicroMachined Thin Film Bulk Acoustic Resonators", *IEEE International Frequency Control Symposium* 1994, 135-138.
Ruby, R. et al., "The Effect of Perimeter Geometry on FBAR Resonator Electrical Performance", *Microwave Symposium Digest, 2005 IEEE MTT-S International* Jun. 12, 2005, 217-221.
Sanchez, A.M. et al., "Mixed Analytical and Numerical Design Method for Piezoelectric Transformers", *IEEE Xplore* 2003, 841-846.
Schoenholz, J.E. et al., "Plasma-Enhanced Deposition of Silicon Oxynitride Films", *Thin Solid Films* 1987, 285-291.
Schuessler, Hans H. , "Ceramic Filters and Resonators", *Reprinted from IEEE Trans. Sonics Ultrason.*, vol. SU-21 Oct. 1974, 257-268.
Shirakawa, A. A. et al., "Bulk Acoustic Wave Coupled Resonator Filters Synthesis Methodology", *2005 European Microwave Conference*, vol. 1 Oct. 2005.
Small, M. K. et al., "A De-Coupled Stacked Bulk Acoustic Resonator (DSBAR) Filter with 2 dB Bandwidth >4%", *2007 IEEE Ultrasonics Symposium* Oct. 2007, 604-607.
Spangenberg, B. et al., "Dependence of the Layer Resistance of Boron Implantation in Silicon and the Annealing Conditions", *Comptus Rendus de l'Academic Bulgare des Sciences*, vol. 33, No. 3 1980, 325-327.
Tas, et al., "Reducing Anchor Loss in Micromechanical Extensional Mode Resonators", *IEEE Transactions on Ultrasonics, Ferroelectrics and Frequency Control*, vol. 57, No. 2. Feb. 2010, 448-454.
Thomsen, C. et al., "Surface Generation and Detection of Phonons by Picosecond Light Pulses", *Phys. Rev. B*, vol. 34 1986, 4129.
Tiersten, H. F. et al., "An Analysis of Thickness-Extensional Trapped Energy Resonant Device Structures with Rectangular Electrodes in the Piezoelectric Thin Film on Silicon Configuration", *J. Appl. Phys.* 54 (10) Oct. 1983, 5893-5910.
Topich, J. A. et al., "Effects of Ion Implanted Fluorine in Silicon Dioxide", *Nuclear Instr. and Methods, Cecon Rec*, Cleveland, OH May 1978, 70-73.
Tsubbouchi, K. et al., "Zero Temperature coefficient Surface Acoustic Wave Devices using Epitaxial AIN Films", *IEEE Ultrasonic symposium*, San Diego, CA, 1082 1982, 240-245.
Vasic, D et al., "A New Method to Design Piezoelectric Transformer Used in MOSFET & IGBT Drive Circuits", *IEEE 34th Annual Power Electronics Specialists Conference*, 2003 vol. 1 Jun. 15-19, 2003, 307-312.
Vasic, D et al., "A New MOSFET & IGBT Gate Drive Insulated by a Piezoelectric Transformer", *IEEE 32 nd Annual Power Electronics Specialists Conference*, 2001 vol. 3 2001, 1479-1484.
Yanagitani, et al., "Giant Shear Mode Electromechanical Coupling Coefficient k15 in C-Axis Tilted ScAlN Films", *IEEE International Ultrasonics Symposium* 2010.
Yang, C.M. et al., "Highly C Axis Oriented AIN Film Using MOCVD for 5GHx Band FBAR Filter", *2003 IEEE Ultrasonics Symposium* Oct. 5, 2003, pp. 170-173.
"IEEE Xplore Abstract for Suppression of Acoustic Energy Leakage in FBARS with Al Bottom Electrode: FEM Simulation and Experimental Results", Oct. 28-31, 2007, 2 pages.
Machine Translation of JP 2007-208845, Aug. 16, 2007, 1-9.
Machine Translation of JP 2008-211394, Sep. 11, 2008, 1-8.
Ohara, et al., "Suppression of Acoustic Energy Leakage in FBARs with Al Bottom Electrode: FEM Simulation and Experimental Results", 2007 IEEE Ultrasonics Symposium Oct. 28-31, 2007, 1657-1660.
Machine translation of DE102007012384, published Sep. 18, 2008.
Machine translation of FR2951027, published Apr. 8, 2011.
Yang, "Spurious Wave Suppression in BAW Resonators with Frame-like Airgap", 2010 IEEE International Frequency Control Symposium, Jun. 1-4, 2010, pp. 656-660.
Machine translation of CN1845453A, published Oct. 11, 2006.
Machine translation of CN101645699A, published Feb. 10, 2010.
Machine translation of CN101931380A, published Dec. 29, 2010.
Office Action Mailed Mar. 9 2015 in Chinese Patent Application No. 201210195961.3 (Unofficial/non-certified translation provided by foreign agent included).
Co-pending U.S. Appl. No. 14/191,771, filed Feb. 27, 2014.
Co-pending U.S. Appl. No. 14/192,599, filed Feb. 27, 2014.
Co-pending U.S. Appl. No. 13/955,774, filed Jul. 31, 2013.
Machine translation of CN1383611A, published Dec. 4, 2002.
Office Action Mailed Apr. 15, 2015 in Chinese Patent Application No. 201210093059.0 (Unofficial/Non-certified translation provided by foreign agent included).
Machine translation of JP2006186412, published Jul. 13, 2006.
Machine translation of JP2008066792, published Mar. 21, 2008.
Machine translation of WO2006079353, published Aug. 3, 2006.
Moriera, et al., "Aluminum Scandium Nitride Thin-Film Bulk Acoustic Resonators for Wide Band Applications", Vacuum 86 (2011) 23-26.
Co-pending U.S. Appl. No. 13/151,631, filed Jun. 2, 2011.
Non-Final Office Action dated Feb. 26, 2014 in U.S. Appl. No. 13/151,631.
Co-pending U.S. Appl. No. 13/036,489, filed on Feb. 28, 2011.
Co-pending U.S. Appl. No. 13/161,946, filed on Jun. 16, 2011.
Co-pending U.S. Appl. No. 13/286,038, filed on Oct. 31, 2011.
Co-pending U.S. Appl. No. 13/654,718, filed on Oct. 18, 2012.
Co-pending U.S. Appl. No. 13/658,024, filed on Oct. 23, 2012.
Co-pending U.S. Appl. No. 13/660,941, filed on Oct. 25, 2012.
Co-pending U.S. Appl. No. 13/663,449, filed on Oct. 29, 2012.
Co-pending U.S. Appl. No. 13/781,491, filed on Feb. 28, 2013.
Lee, et al. "Development of High-Quality FBAR Devices for Wireless Applications Employing Two-Step Annealing Treatments", IEEE Microwave and Wireless Components Letters, vol. 21, No. 11, Nov. 2011.

(56) References Cited

OTHER PUBLICATIONS

Tang, et al. "Micromachined Bulk Acoustic Resonator with a Raised Frame", 16th International Conference on Mechatronics Technology, Oct. 16-19, 2012, Tianjen, China.

Allah, et al. "Solidly mounted BAW resonators with layer-transferred AlN using sacrificial Si surfaces", Solid State Electronics, vol. 54, Issue 9, Sep. 2010, pp. 1041-1046.

Dubois, et al. "Solidly Mounted Resonator Based on Aluminum Nitride Thin Film", 1998 IEEE Ultrasonics Symposium, p. 909-912.

Strijbos, et al. "Design and Characterisation of High-Q Solidly-Mounted Bulk Acoustic Wave Filters", IEEE 2007 Electronics Components and Technology Conference, p. 169-174.

UK Search Report mailed Jan. 6, 2009 for Application No. GB0522393.8.

UK Search Report mailed Feb. 2, 2006 for Application No. GB0525884.3.

UK Search Report mailed Jul. 11, 2006 for Application No. GB0605222.9.

Co-pending U.S. Appl. No. 13/074,262, filed on Mar. 29, 2011.

Co-pending U.S. Appl. No. 13/101,376, filed on May 5, 2011.

UK Examination Report dated Aug. 25, 2006 for Application No. GB0605770.7.

UK Examination Report dated Aug. 24, 2006 for Application No. GB0605971.1.

UK Search Report mailed Mar. 29, 2007 for Application No. GB0617742.2.

UK Search Report mailed Jun. 26, 2006 for Application No. GB0605225.2.

UK Search Report mailed Nov. 15, 2006 for Application No. GB0620152.9.

UK Search Report mailed Nov. 17, 2006 for Application No. GB0620653.6.

UK Search Report mailed Nov. 17, 2006 for Application No. GB0620655.1.

UK Search Report mailed Nov. 23, 2006 for Application No. GB0620657.7.

UK Search Report mailed Aug. 23, 2006 for Application No. GB0605779.8.

UK Search Report mailed Nov. 30, 2006 for Application No. GB0619698.4.

Co-pending U.S. Appl. No. 13/662,425, filed Oct. 27, 2012.

Co-pending U.S. Appl. No. 13/662,460, filed Oct. 27, 2012.

Co-pending U.S. Appl. No. 13/766,993, filed Feb. 14, 2013.

Co-pending U.S. Appl. No. 13/767,754, filed Feb. 14, 2013.

Co-pending U.S. Appl. No. 13/767,765, filed Feb. 14, 2013.

Co-pending U.S. Appl. No. 14/092,077, filed Nov. 27, 2013.

Aigner, "SAW, BAW and the Future of Wireless", May 6, 2013, 6 pages.

El Hassan, et al. "Techniques for Tuning BAW-SMR Resonators for the 4th Generation of Mobile Communications", Intech, 2013, chapter 18 pp. 421-442.

Pineda, "Thin-Film Bulk Acoustic Wave Resonators—FBAR", Dec. 2007, 241 pages.

Umeda, et al. "Piezoelectric Properties of ScAlN Thin Films for Piezo-Mems Devices", MEMS 2013, Taipei, Taiwan, Jan. 20-24, 2013, pp. 733-736.

Machine Translation of CN101170303, published Apr. 30, 2008.

\* cited by examiner

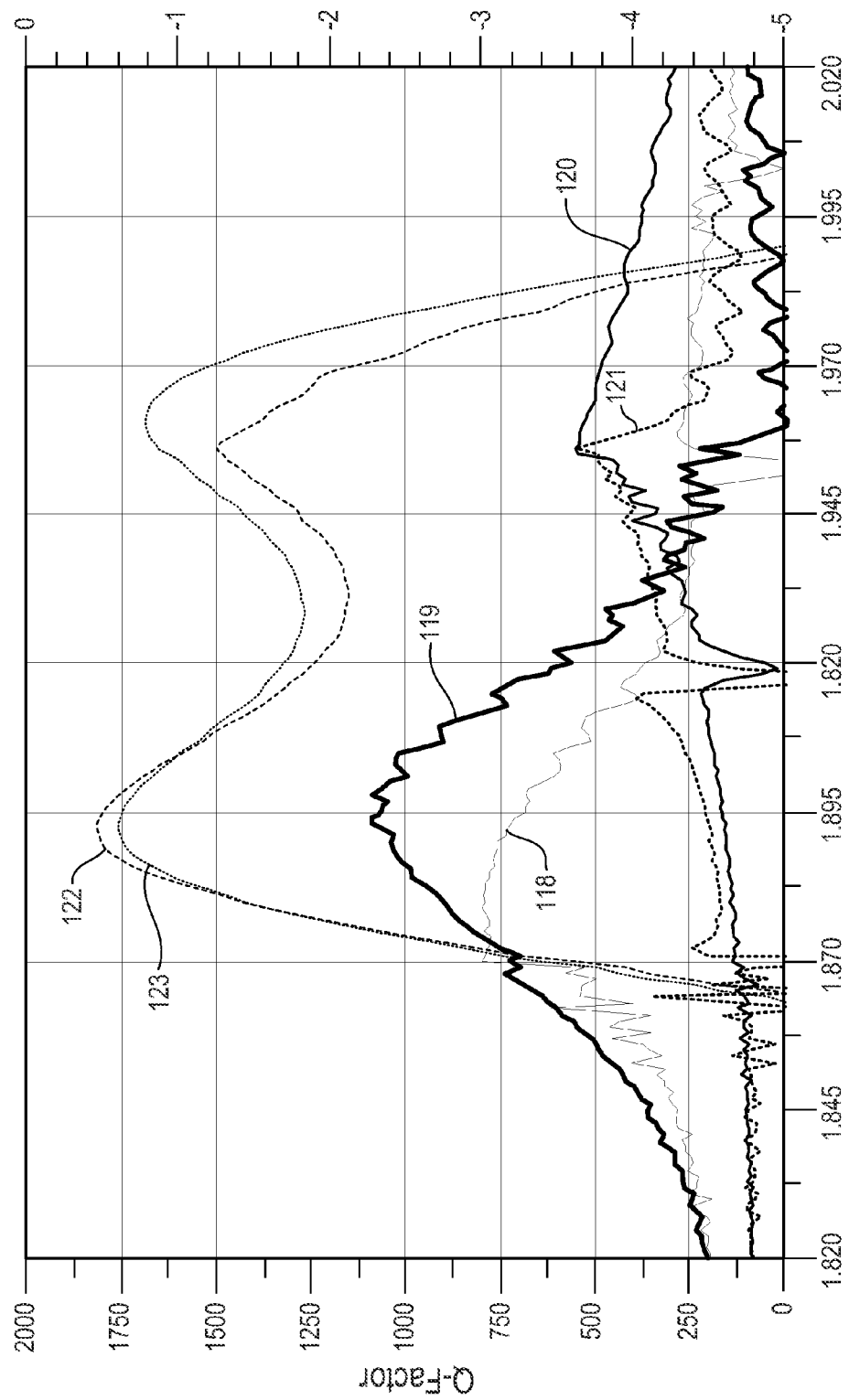

COUPLED RESONATOR FILTER COMPRISING A BRIDGE AND FRAME ELEMENTS

CROSS-REFERENCE TO RELATED APPLICATIONS

This application is a continuation-in-part application of commonly owned U.S. patent application Ser. No. 13/036,489 entitled "Coupled Resonator Filter Comprising Bridge" filed on Feb. 28, 2011 (published on Aug. 30, 2012, as U.S. Patent Application Pub. No. 2012/0218056) to Dariusz Burak. The present application claims priority under 35 U.S.C. §120 to U.S. patent application Ser. No. 13/036,489, the disclosure of which is hereby incorporated by reference in its entirety.

BACKGROUND

In many electronic applications, electrical resonators are used. For example, in many wireless communications devices, radio frequency (RF) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a Bulk Acoustic Wave (BAW) resonator. The BAW resonator includes an acoustic stack comprising, inter alia, a layer of piezoelectric material disposed between two electrodes. Acoustic waves achieve resonance across the acoustic stack, with the resonant frequency of the waves being determined by the materials in the acoustic stack. One type of BAW resonator comprises a piezoelectric film for the piezoelectric material. These resonators are often referred to as Film Bulk Acoustic Resonators (FBAR).

FBARs are similar in principle to bulk acoustic resonators such as quartz, but are scaled down to resonate at GHz frequencies. Because the FBARs have thicknesses on the order of microns and length and width dimensions of hundreds of microns, FBARs beneficially provide a comparatively compact alternative to certain known resonators.

FBARs may comprise an acoustic stack disposed over air. In such a structure, the acoustic stack can be referred to as a membrane. Often, the membrane is suspended over a cavity provided in a substrate. Other FBARs comprise the acoustic stack formed over an acoustic mirror formed in the substrate.

Filters based on FBAR technology provide a comparatively low in-band insertion loss due to the comparatively high quality (Q) factor of FBAR devices. FBAR-based filters are often employed in cellular or mobile telephones that can operate in multiple frequency bands. In such devices, it is important that a filter intended to pass one particular frequency band ("the passband") should have a high level of RF signal reflection at other nearby frequency bands which contain signals that should be rejected. Specifically, there may be one or more frequencies or frequency bands near the passband which contain signals at relatively high amplitudes that should be rejected by the filter. In such cases, it would be beneficial to be able to increase the filter's rejection characteristics at those particular frequencies or frequency bands, even if the rejection at other frequencies or frequency bands does not receive the same level of rejection.

One type of filter based on FBAR technology is known as a coupled resonator filter (CRF). A CRF comprises a coupling structure disposed between two vertically stacked FBARs. The CRF combines the acoustic action of the two FBARs and provides a bandpass filter transfer function. For a given acoustic stack, the CRF has two fundamental resonance modes, a symmetric mode and an anti-symmetric mode, of different frequencies. The degree of difference in the frequencies of the modes depends, inter alia, on the degree or strength of the coupling between the two FBARs of the CRF. If the degree of coupling between the two FBARs is too great (over-coupled), the passband is unacceptably wide, and an unacceptable 'swag' or 'dip' in the center of the passband results, as does an attendant unacceptably high insertion loss in the center of the passband. If the degree of coupling between the FBARs is too low (under-coupled), the passband of the CRF is too narrow.

All FBARs and filters based on FBARs have an active region. The active region of a CRF comprises the region of overlap of the top FBAR, the coupling structure, and the bottom FBAR. Generally, it is desirable to confine the acoustic energy of certain desired acoustic modes within the active region. As should be appreciated by one of ordinary skill in the art, at the boundaries of the active region, reflection of desired modes can result in mode conversion into spurious/undesired modes, and loss of acoustic energy over a desired frequency range (e.g., the passband of the CRF).

In FBAR devices, mitigation of acoustic losses at the boundaries and the resultant mode confinement in the active region of the FBAR (the region of overlap of the top electrode, the piezoelectric layer, and the bottom electrode) has been effected through various methods. Notably, frames are provided along one or more sides of the FBARs. The frames create an acoustic impedance mismatch that reduces losses by reflecting desired modes back to the active area of the resonator, thus improving the confinement of desired modes within the active region of the FBAR.

While the incorporation of frames has resulted in improved mode confinement and attendant improvement in the quality (Q) factor of the FBAR, further improvements in mode confinement and Q in CRFs are desired.

What is needed, therefore, is a BAW resonator structure that overcomes at least the shortcomings of known BAW resonator structures described above.

BRIEF DESCRIPTION OF THE DRAWINGS

The illustrative embodiments are best understood from the following detailed features are not necessarily drawn to scale. In fact, the dimensions may be arbitrarily increased or decreased for clarity of discussion. Wherever applicable and practical, like reference numerals embodiment.

FIG. 1C is a graphical representation of the insertion loss ($S_{21}$ in dB) and the Q factors of odd and even modes ($Q_o$ and $Q_e$) of a known CRF and a CRF in accordance with a representative embodiment.

FIG. 1D is a cross-sectional view of a CRF in accordance with a representative embodiment.

DEFINED TERMINOLOGY

Figure 1A:
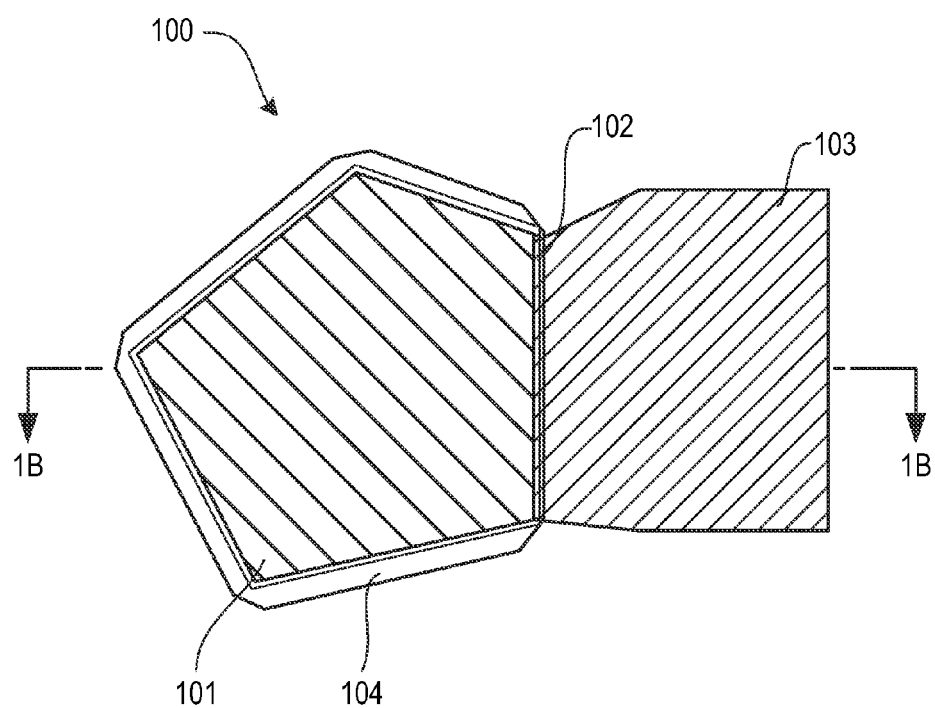
FIG. 1A shows a top-view of a CRF in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to within acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

The present teachings relate generally to BAW resonator-based filters (e.g., CRFs) including FBAR-based filters, their materials and their methods of fabrication. Certain details of FBAR-based filters, materials thereof and their methods of fabrication may be found in one or more of the following commonly owned U.S. Patents, Patent Application Publications and Patent Applications: U.S. Pat. No. 6,107,721, to Lakin; U.S. Pat. Nos. 5,587,620, 5,873,153 and 6,507,983 to Ruby, et al.; U.S. Pat. No. 7,629,854 to Richard C. Ruby, et al.; U.S. Pat. No. 7,280,007 to Hongjun Feng, et al.; U.S. Patent Application Publication No. 2007/0205850 to Jamneala, et al.; U.S. Pat. No. 7,388,454 to Richard C. Ruby, et al; U.S. Patent Application Publication No. 2010/0327697 to John Choy, et al.; and U.S. Patent Application Publication No. 2010/0327994 to John Choy, et al. The disclosures of these patents, patent application publications and patent applications are specifically incorporated herein by reference. It is emphasized that the components, materials and method of fabrication described in these patents, patent application publications and patent applications are representative and other methods of fabrication and materials within the purview of one of ordinary skill in the art are contemplated.

FIG. 1A shows a top view of a CRF 100 in accordance with a representative embodiment. The CRF 100 comprises a top electrode 101 (referred to below as second upper electrode 101), comprising five (5) sides, with a connection side 102 configured to provide the electrical connection to an interconnect 103. The interconnect 103 provides electrical signals to the top electrode 101 to excite desired acoustic waves in piezoelectric layers (not shown in FIG. 1) of the CRF 100. The top electrode 101 comprises a bridge 104 (referred to below as second bridge 104) disposed on all sides (the bridge on the connection side 102 cannot be seen in the top view of FIG. 1A). As described more fully below, providing the bridge 104 about the perimeter of the CRF 100 contributes to improved insertion loss and the Q-factors of odd and even modes ($Q_o$ and $Q_e$ respectively) over a desired frequency range (e.g., a passband of the CRF). Notably, an inner raised region disposed over the top electrode 101, an outer raised region disposed over the top electrode 101, and a combination of an inner raised region and an outer raised region disposed over the top electrode 101, described in connection with representative embodiments below are not depicted in FIG. 1A.

Figure 1B:
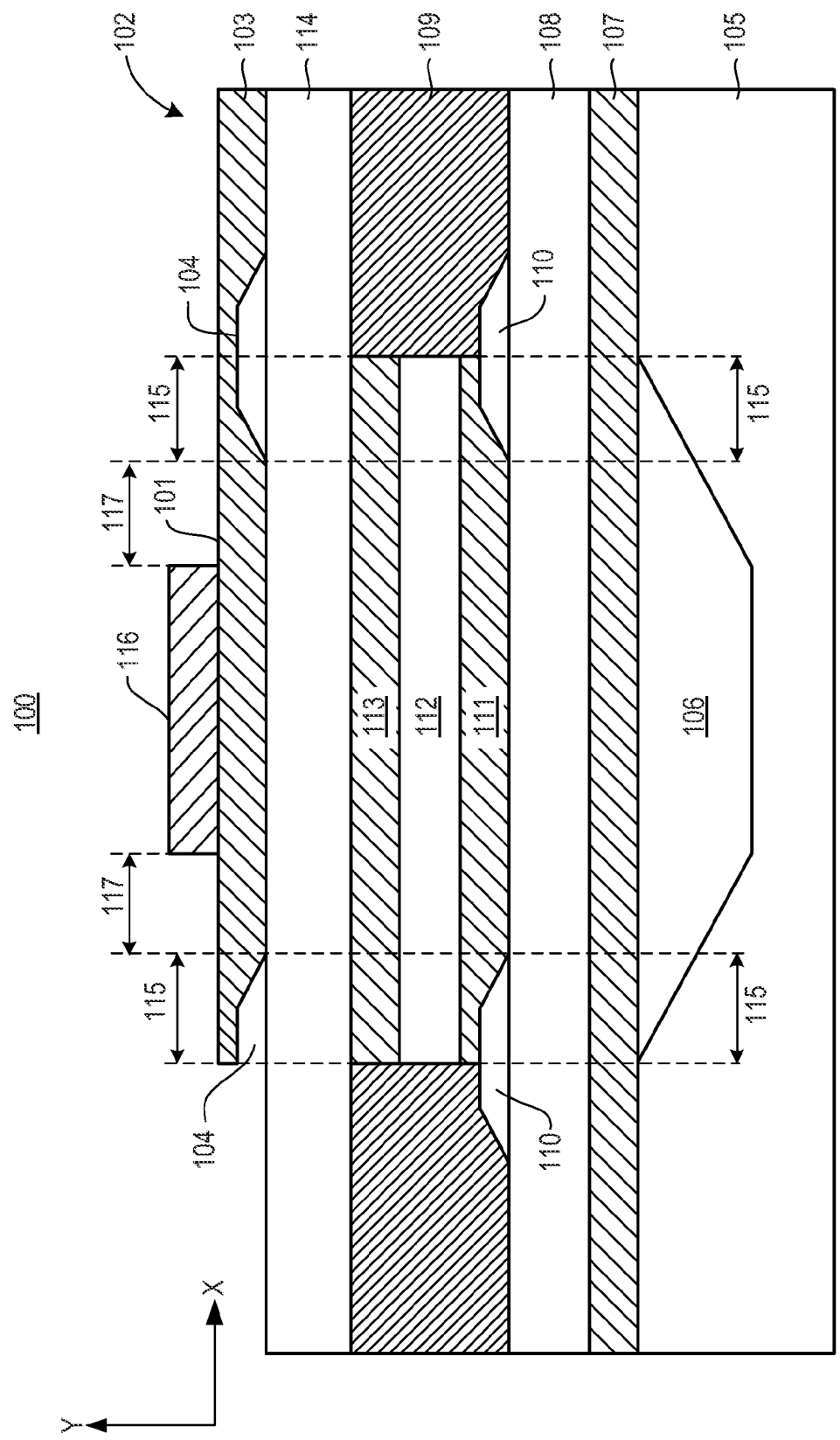
FIG. 1B is a cross-sectional view of the CRF of FIG. 1A, taken along the line 1B-1B.

FIG. 1B shows a cross-sectional view of the CRF 100 in accordance with a representative embodiment taken along the line 1B-1B. The CRF 100 comprises a plurality of layers disposed over a substrate 105 having a cavity 106. The inclusion of a cavity 106 for reflection of acoustic waves in the CRF 100 is merely illustrative. It is emphasized that rather than cavity 106, a known acoustic reflector (e.g., a Bragg mirror (not shown)) comprising alternating layers of high and low acoustic impedance may be provided in the substrate 105 to provide acoustic isolation.

A first lower electrode 107 is disposed over the substrate 105 and partially over the cavity 106 (or Bragg mirror). A first piezoelectric layer 108 is disposed over the first lower electrode 107. A planarization layer 109 is disposed over the first piezoelectric layer 108 and generally does not overlap the cavity 106. In a representative embodiment, the planarization layer 109 comprises non-etchable borosilicate glass (NEBSG). As should be appreciated by one of ordinary skill in the art, the structure provided by the first lower electrode 107, the first piezoelectric layer 108 and the first upper electrode 111 is a bulk acoustic wave (BAW) resonator, which in this illustrative embodiment comprises a first BAW resonator of the CRF 100. When the BAW resonator is disposed over a cavity, it is a so-called FBAR; and when the BAW resonator is disposed over an acoustic reflector (e.g., Bragg mirror) it is a so-called solidly mounted resonator (SMR). The present teachings contemplate the use of either FBARs or SMRs in filters (e.g., CRFs).

A first bridge 110 is provided at an interface of a first upper electrode 111 and the planarization layer 109, and is disposed about the perimeter of the CRF 100. In the embodiments described herein, the first and second bridges 110, 104 are disposed in the first upper electrode 111 and the second upper electrode 104. It is emphasized that this is merely illustrative and, as described in the parent application, the first and second bridges 110, 104 may be provided in other layers of the "stack" that make up the CRF 100. Furthermore, in the presently described embodiments, bridges are provided in two layers of the CRF 100. Again, this is merely illustrative, and as described in the parent application, a bridge may be provided in one layer of the stack of layers that comprise the CRF 100.

In representative embodiments first and second bridges 110, 104 have a trapezoidal cross-sectional shape. It is emphasized that the trapezoidal cross-sectional shape of the bridges of the representative embodiments is merely illustrative and the bridges are not limited to a trapezoidal cross-sectional shape. For example, the cross-sectional shape of the bridges of the representative embodiments could be square or rectangular, or of an irregular shape. The "slanting" walls of first and second bridges 110, 104 (and other bridges described in connection with representative embodiments below) is beneficial to the quality of layers (e.g., the quality of the crystalline piezoelectric layer(s)) grown over the first and second bridges 110, 104 (and other bridges described in connection with representative embodiments below).

The first bridge 110 and the second bridge 104 (and other bridges described in connection with representative embodiments below) are not necessarily the same shape (e.g., one could have trapezoidal cross-sectional shape and one could have a rectangular cross-sectional in shape). Typical dimensions of the first and second bridges 110, 104 (and other bridges described in connection with representative embodiments below) are approximately 2.0 μm to approximately 10.0 μm in width (x-dimension in the coordinate system shown in FIG. 1B) and approximately 300 Å to approximately 1500 Å in height (y-dimension in the coordinate system shown in FIG. 1B). In certain embodiments, first and second bridges 110, 104 (and other bridges described in connection with representative embodiments below) extend over the cavity 106 (depicted as overlap 115 in FIG. 1B). The overlap 115 has a width (x-dimension) of approximately 0.0 μm (i.e., no overlap with the cavity 106) to approximately 5.0 μm. Notably, the first bridge 110 and the second bridge 104 (and other bridges described in connection with representative embodiments below) do not need to be the same dimensions or located at the same relative position. For example, the overlap 115 of the first and second bridges 110 with cavity 106 is shown in FIG. 1B to be identical for all bridges 104, 110; but this is not essential as different bridges 104, 110 may overlap the cavity 106 to a greater or lesser extent than other bridges 104, 110.

As described in the parent application, the width and position of the first and second bridges 110, 104 (and other bridges described in connection with representative embodiments) and overlap 115 with the cavity 106 are selected to improve Q-enhancement of resonant mode. In general, the greater the overlap 115 of each bridge 104, 110 with the cavity 106 of the CRF 100, the greater the improvement $Q_o$ and $Q_e$ with the improvement realized being fairly small after an initial increase. The improvement in $Q_o$ and $Q_e$ must be weighed against a decrease in the electromechanical effective coupling coefficient $kt^2$, which decreases with increasing overlap 115 of the first and second bridges 110, 104 with the cavity 106. Degradation of $kt^2$ results in a degradation of insertion loss ($S_{21}$). As such, the overlap 115 of the first and second bridges 110, 104 with the cavity 106 is typically optimized experimentally.

The first and second bridges 110, 104 (and other bridges described in connection with representative embodiments below) have a height (y-dimension in the coordinate system of FIG. 1B) of approximately 300 Å to approximately 1500 Å. Notably, the lower limit of the height is determined by the limits of the process of releasing sacrificial material in the forming of the first and second bridges 110, 104 (and other bridges described in connection with representative embodiments below), and the upper limit of the height is determined by the quality of layers grown over the first and second bridges 110, 104 (and other bridges described in connection with representative embodiments) and by the quality of subsequent processing of possibly non-planar structures. An acoustic coupling layer 112 ("coupling layer 112") is provided over the first upper electrode 111.

In a representative embodiment, the coupling layer 112 comprises NEBSG, or carbon-doped silicon oxide (SiOCH) such as described in commonly owned U.S. patent application Ser. No. 12/710,640, entitled "Bulk Acoustic Resonator Structures Comprising a Single Material Acoustic Coupling Layer Comprising Inhomogeneous Acoustic Property" to Elbrecht, et al. and filed on Feb. 23, 2010. The disclosure of this patent application is specifically incorporated herein by reference. Notably, SiOCH films of the representative embodiment belong to a general class of comparatively low dielectric constant (low-k) dielectric materials often referred to as carbon-doped oxide (CDO). Alternatively, the coupling layer 112 may comprise other dielectric materials with suitable acoustic impedance and acoustic attenuation, including, but not limited to porous silicon oxynitride (SiON); porous boron doped silicate glass (BSG); or porous phosphosilicate glass (PSG). Generally, the material used for the coupling layer 112 is selected to provide comparatively low acoustic impedance and loss in order to provide desired pass-band characteristics.

A second lower electrode 113 is provided over the coupling layer 112, and a second piezoelectric layer 114 is provided over the second lower electrode 113. The second upper electrode 101 is provided over the second piezoelectric layer 114.

The first lower electrode 107, the first upper electrode 111, the second lower electrode 113 and the second upper electrode 101 are selected from molybdenum (Mo), tungsten (W) or copper (Cu). Illustratively, the first lower electrode 107 and the second upper electrode 101 are molybdenum (Mo) having a thickness (y-dimension in the coordinate system depicted in FIG. 1B) of approximately 1000 Å to approximately 18000 Å. The first piezoelectric layer 108 and the second piezoelectric layer 114 are illustratively aluminum nitride (AlN) having a thickness of approximately 5000 Å to approximately 25000 Å. The first upper electrode 111 and the second lower electrode 113 are illustratively tungsten (W) having a thickness of approximately 1000 Å to approximately 18000 Å.

The second bridge 104 is disposed about the perimeter of the CRF 100. As should be appreciated by one of ordinary skill in the art, the structure provided by the second lower electrode 113, the second piezoelectric layer 114 and the second upper electrode 101 is a (BAW) resonator, which in this illustrative embodiment comprises a second BAW resonator of the CRF 100.

As should be appreciated by one of ordinary skill in the art, the structure provided by the second lower electrode 113, the second piezoelectric layer 114 and the second upper electrode 101 is an FBAR, which in this illustrative embodiment comprises the upper FBAR of the CRF 100.

The first and second bridges 110, 104 are formed by patterning a sacrificial material over the first piezoelectric layer 108 and the second piezoelectric layer 114, and forming the depicted layers thereover. After the layers of the CRF 100 are formed as desired, the sacrificial material is released leaving the first and second bridges 110, 104 "filled" with air. In a representative embodiment, the sacrificial material used to form the first and second bridges 110, 104 is the same as the sacrificial material used to form the cavity 106 (e.g., PSG). In the representative embodiment shown and described in connection with FIG. 1B, the first and second bridges 110, 104 were unfilled (i.e., contained air as the acoustic medium). As described in the parent application, one or both of first and second bridges 110, 104 are filled with a material to provide the acoustic impedance discontinuity to reduce losses.

In a representative embodiment, the first bridge 110 and the second bridge 104 provide a perimeter around an active region of the CRF 100. The active region thus includes the portions of the first BAW resonator, the second BAW resonator, the coupling layer 112 disposed over the cavity 106 (or other acoustic reflector), and bounded by the perimeter provided by the first bridge 110 and the second bridge 104. As should be appreciated by one of ordinary skill in the art, the active region of the CRF 100 is bordered around its perimeter by an acoustic impedance discontinuity created at least in part by the first and second bridges 110, 104, and above and below (cavity 106) by an acoustic impedance discontinuity due to the presence of air. Thus, a resonant cavity is beneficially provided in the active region of the CRF 100. In certain embodiments, the first bridge 110 and the second bridge 104 are unfilled (i.e., contain air), as is the cavity 106. In other embodiments described more fully below, the first bridge 110, the second bridge 104, or both, are filled with a material to provide the desired acoustic impedance discontinuity.

It is noted that the first bridge 110, or the second bridge 104, or both, do not necessarily have to extend along all edges of the CRF 100, and therefore not along the entire perimeter of the CRF 100. For example, the first bridge 110 or the second bridge 104, or both, may be provided on four "sides" of the five-sided CRF 100 shown in FIG. 1A. In certain embodiments, the first bridge 110 is disposed along the same four sides of the CRF, for example, as the second bridge 104. In other embodiments, the first bridge 110 is disposed along four sides (e.g., all sides but the connection side 102) of the CRF 100 and the second bridge 104 is disposed along four sides of the CRF 100, but not the same four sides as the first bridge 110 (e.g., second bridge 104 is disposed along the connection side 102).

An inner raised region 116 is provided over the second upper electrode 101 in the depicted representative embodiment. Certain aspects of the inner raised region 16 are described in commonly owned U.S. patent application Ser. No. 13/074,094, entitled "Stacked Bulk Acoustic Resonator and Method of Making the Same" filed on Mar. 29, 2011, to Dariusz Burak, et al. The entire disclosure of U.S. patent application Ser. No. 13/074,094 is specifically incorporated herein by reference.

The inner raised region 116 is formed in an inner portion of the second upper electrode 101, for example, substantially in the geometric center of the second upper electrode 101. The inner raised region 116 is separated by a distance 117 from the edge of the active region of the CRF 100. The distance 117 as well as the thickness (y-dimension in the depicted coordinate system) of an inner raised region 116 determine how strongly the unwanted modes for frequencies below series resonance frequency Fs of a given mode (that is odd mode or an even mode) get suppressed. In a non-limiting illustrative configuration, the distance 117 may be approximately 1 μm to 10 μm, depending on a required operating frequency range and the selected materials that comprise the CRF 100. Generally, application of the inner raised region 116 shifts the resonant frequency ("cut-off frequency") of the corresponding region of CRF 100, and otherwise improves operation of the CRF 100, for example, by providing suppression of unwanted lateral modes for frequencies below series resonance frequency Fs. An increase in thickness of the inner raised region 116 causes the resonant frequency of the CRF 100 to shift lower, and conversely a decrease in the thickness of the inner raised region 116 causes the resonant frequency to shift higher. In a non-limiting illustrative configuration, the inner raised region 116 may be approximately 50 Å to approximately 500 Å in thickness. If the distance 117 is too narrow or the thickness of an inner raised region 116 is too small, the degree of suppression of unwanted modes is negligible. If the distance 117 is too wide or the thickness of an inner raised region 116 is too large, the spectral performance above series resonance frequency deteriorates making such configuration impractical. Thus the optimum distance 117 and the thickness of the inner raised region 116 may be found experimentally. The inner raised region 116 may be an additional thin layer of material or a protrusion from the second upper electrode 101 as described in U.S. patent application Ser. No. 13/074,094. Notably, the CRF 100 may be apodized or irregular in shape, where the inner raised region 116 may be of the same shape. As such, the inner raised region 116 has an outer perimeter that follows the outer perimeter of the second upper electrode 101. Of course, the CRF 100 may be formed in alternative shapes, such as circular, square, rectangular, trapezoidal, etc., without departing from the scope of the present teachings. The inner raised region 116 has substantially the same shape as the CRF 100. However, in various embodiments, the inner raised region 116 may be shaped differently from one another and/or from the CRF 100.

The inner raised region 116 may be formed of electrically conductive materials, such as W, Mo or Cu, for example, and may be the same material as the second upper electrode 101. Alternatively, the inner raised region 116 may be formed of different materials than the second upper electrode 101. Also, inner raised regions 116 may be formed of a dielectric material, such as silicon dioxide ($SiO_2$), silicon nitride (SiN), silicon carbide (SiC), AlN, ZnO or PZT, for example. In alternative embodiments the inner raised region 116 may be formed on layers other than the second upper electrode 101. Notably inner raised region 116 can be formed on first lower electrode 107, first upper electrode 111, or second lower electrode 113, or on a plurality of the first lower electrode 107, the first upper electrode 111, the second lower electrode 113 and the second upper electrode 101. It should be pointed out that any such alternative placement of inner raised region 116 increases complexity of the fabrication of CRF 100, but it may yield an improved device performance.

In conjunction with the first and second bridges 110, 104, the inner raised region 116 provides an the acoustic impedance mismatch that causes reflection and suppression of acoustic waves at the boundary that may otherwise excite unwanted acoustic modes that can propagate out of the active region and be lost, resulting in energy loss. The first bridge 110, the second bridge 104 and the inner raised region 116 serve to confine the modes of interest within the active region of the CRF 100 and reduce energy losses in the CRF. Reducing such losses serves to increase the Q-factor of the modes ($Q_o$ and $Q_e$) of interest in the CRF 100, and improve insertion loss over the passband of the CRF 100.

FIG. 1C is a graphical representation of the Q-factor (left vertical axis) versus frequency and insertion loss ($S_{21}$) (right axis) versus frequency for CRF 100 described in connection with FIG. 1B above. As described presently, FIG. 1C shows a comparison of measured insertion loss ($S_{21}$), the odd mode Q ($Q_o$) and the even mode Q ($Q_e$) of a known CRF with those of CRF 100 of a representative embodiment.

Curve 118 depicts $Q_o$ of a known CRF and curve 119 depicts $Q_o$ of CRF 100 of the representative embodiment described in connection with FIG. 1B. Compared to the known CRF, an improvement of $Q_o$ up to 30% (depending on frequency of operation, e.g. at 1.89 GHz) is realized due to the increased confinement of an odd mode in the CRF 100 by use of first and second bridges 110, 104 and inner raised region 116 of the representative embodiment.

Curve 120 depicts $Q_e$ of a mode in a known CRF and curve 121 depicts $Q_e$ of a mode in CRF 100. Compared to a known CRF, (depending on frequency, e.g. at 1.96 GHz) $Q_e$ is substantially unchanged by use of first and second bridges 110, 104 and inner raised region 116 of the representative embodiment. In this particular illustration, $Q_e$ of a mode in CRF 100 appears not to exhibit expected performance improvements, because of either the process issues or non-optimal mutual design and alignment of inner raised region 116 and first and second bridges 104 and 110. Nevertheless, numerical simulations (not shown here) suggest that it is possible to simultaneously improve both $Q_o$ and $Q_e$ of CRF 100 to provide improved insertion loss in a selected range of frequencies.

Curve 122 shows the insertion loss of a known CRF over the frequency range of approximately 1.89 GHz to approximately 1.99 GHz. Curve 123 shows the insertion loss of CRF 100. Compared to known CRF, an improvement of insertion loss of approximately 0.2 dB (depending on frequency of operation, e.g. at 1.89 GHz) is realized due to increased energy confinement of in the CRF 100 by use of first and second bridges 110, 104 and inner raised region 116 of the representative embodiment.

FIG. 1D shows a cross-sectional view of the CRF 100 in accordance with a representative embodiment. The CRF 100 comprises a plurality of layers disposed over a substrate 105 having an acoustic reflector 120. The acoustic reflector 120 is a so-called Bragg mirror, and comprises alternating layers 121-126 of low acoustic impedance material and high acoustic impedance materials, with the "odd" numbered layers being low acoustic impedance materials and the "even" numbered layers being high acoustic impedance materials.

The first lower electrode 107 is disposed over the substrate 105 and partially over the acoustic reflector. The first piezoelectric layer 108 is disposed over the first lower electrode 107. The planarization layer 109 is disposed over the first piezoelectric layer 108 and generally does not overlap the acoustic reflector 120. In a representative embodiment, the planarization layer 109 comprises non-etchable borosilicate glass (NEBSG). As should be appreciated by one of ordinary skill in the art, the structure provided by the first lower electrode 107, the first piezoelectric layer 108 and the first upper electrode 111 is a bulk acoustic wave (BAW) resonator, which in this illustrative embodiment comprises a first BAW resonator of the CRF 100. When the BAW resonator is disposed over a cavity, it is a so-called FBAR; and when the BAW resonator is disposed over an acoustic reflector (e.g., Bragg mirror) it is a so-called solidly mounted resonator (SMR). The present teachings contemplate the use of either FBARs or SMRs in filters (e.g., CRFs).

The first bridge 110 is provided at an interface of the first upper electrode 111 and the planarization layer 109, and is disposed along the perimeter of the CRF 100. In the embodiments described herein, the first and second bridges 110, 104 are disposed in the first upper electrode 111 and the second upper electrode 104. It is emphasized that this is merely illustrative and, as described in the parent application, the first and second bridges 110, 104 may be provided in other layers of the "stack" that make up the CRF 100. Furthermore, in the presently described embodiments, bridges are provided in two layers of the CRF 100. Again, this is merely illustrative, and as described in the parent application, a bridge may be provided in one layer of the stack of layers that comprise the CRF 100.

In representative embodiments first and second bridges 110, 104 have a trapezoidal cross-sectional shape. It is emphasized that the trapezoidal cross-sectional shape of the bridges of the representative embodiments is merely illustrative and the bridges are not limited to a trapezoidal cross-sectional shape. For example, the cross-sectional shape of the bridges of the representative embodiments could be square or rectangular, or of an irregular shape. The "slanting" walls of first and second bridges 110, 104 (and other bridges described in connection with representative embodiments below) is beneficial to the quality of layers (e.g., the quality of the crystalline piezoelectric layer(s)) grown over the first and second bridges 110, 104 (and other bridges described in connection with representative embodiments below).

The first bridge 110 and the second bridge 104 (and other bridges described in connection with representative embodiments below) are not necessarily the same shape (e.g., one could have trapezoidal cross-sectional shape and one could have a rectangular cross-sectional in shape). Typical dimensions of the first and second bridges 110, 104 (and other bridges described in connection with representative embodiments below) are approximately 2.0 μm to approximately 10.0 μm in width (x-dimension in the coordinate system shown in FIG. 1B) and approximately 300 Å to approximately 1500 Å in height (y-dimension in the coordinate system shown in FIG. 1B). In certain embodiments, first and second bridges 110, 104 (and other bridges described in connection with representative embodiments below) extend over the acoustic reflector 120 (depicted as overlap 115 in FIG. 1D). The overlap 115 has a width (x-dimension) of approximately 0.0 μm (i.e., no overlap with the acoustic reflector 120) to approximately 5.0 μm. Notably, the first bridge 110 and the second bridge 104 (and other bridges described in connection with representative embodiments below) do not need to be the same dimensions or located at the same relative position. For example, the overlap 115 of the first and second bridges 110 with acoustic reflector 120 is shown in FIG. 1D to be identical for all bridges 104, 110; but this is not essential as different bridges 104, 110 may overlap the acoustic reflector 120 to a greater or lesser extent than other bridges 104, 110.

As described in the parent application, the width and position of the first and second bridges 110, 104 (and other bridges described in connection with representative embodiments) and overlap 115 with the acoustic reflector 120 are selected to improve Q-enhancement of resonant mode. In general, the greater the overlap 115 of each bridge 104, 110 with the acoustic reflector 120 of the CRF 100, the greater the improvement $Q_o$ and $Q_e$ with the improvement realized being fairly small after an initial increase. The improvement in $Q_o$ and $Q_e$ must be weighed against a decrease in the electromechanical effective coupling coefficient $kt^2$, which decreases with increasing overlap 115 of the first and second bridges 110, 104 with the acoustic reflector 120. Degradation of $kt^2$ results in a degradation of insertion loss ($S_{21}$). As such, the overlap 115 of the first and second bridges 110, 104 with the acoustic reflector 120 is typically optimized experimentally.

The first and second bridges 110, 104 (and other bridges described in connection with representative embodiments below) have a height (y-dimension in the coordinate system of FIG. 1D) of approximately 300 Å to approximately 1500 Å. Notably, the lower limit of the height is determined by the limits of the process of releasing sacrificial material in the forming of the first and second bridges 110, 104 (and other bridges described in connection with representative embodiments below), and the upper limit of the height is determined by the quality of layers grown over the first and second bridges 110, 104 (and other bridges described in connection with representative embodiments) and by the quality of subsequent processing of possibly non-planar structures. An acoustic coupling layer 112 ("coupling layer 112") is provided over the first upper electrode 111.

In a representative embodiment, the coupling layer 112 comprises NEBSG, or carbon-doped silicon oxide (SiOCH) such as described in commonly owned U.S. patent application Ser. No. 12/710,640, entitled "Bulk Acoustic Resonator Structures Comprising a Single Material Acoustic Coupling Layer Comprising Inhomogeneous Acoustic Property" to Elbrecht, et al. and filed on Feb. 23, 2010. The disclosure of this patent application is specifically incorporated herein by reference. Notably, SiOCH films of the representative embodiment belong to a general class of comparatively low dielectric constant (low-k) dielectric materials often referred to as carbon-doped oxide (CDO). Alternatively, the coupling layer 112 may comprise other dielectric materials with suitable acoustic impedance and acoustic attenuation, including, but not limited to porous silicon oxynitride (SiON); porous boron doped silicate glass (BSG); or porous phosphosilicate glass (PSG). Generally, the material used for the coupling layer 112 is selected to provide comparatively low acoustic impedance and loss in order to provide desired pass-band characteristics.

A second lower electrode 113 is provided over the coupling layer 112, and a second piezoelectric layer 114 is provided over the second lower electrode 113. The second upper electrode 101 is provided over the second piezoelectric layer 114.

The first lower electrode 107, the first upper electrode 111, the second lower electrode 113 and the second upper electrode 101 are selected from molybdenum (Mo), tungsten (W) or copper (Cu). Illustratively, the first lower electrode 107 and the second upper electrode 101 are molybdenum (Mo) having a thickness (y-dimension in the coordinate system depicted in FIG. 1D) of approximately 1000 Å to approximately 18000 Å. The first piezoelectric layer 108 and the second piezoelectric layer 114 are illustratively aluminum nitride (AlN) having a thickness of approximately 5000 Å to approximately 25000 Å. The first upper electrode 111 and the second lower electrode 113 are illustratively tungsten (W) having a thickness of approximately 1000 Å to approximately 18000 Å.

The second bridge 104 is disposed about the perimeter of the CRF 100. As should be appreciated by one of ordinary skill in the art, the structure provided by the second lower electrode 113, the second piezoelectric layer 114 and the second upper electrode 101 is a (BAW) resonator, which in this illustrative embodiment comprises a second BAW resonator of the CRF 100.

As should be appreciated by one of ordinary skill in the art, the structure provided by the second lower electrode 113, the second piezoelectric layer 114 and the second upper electrode 101 is an FBAR, which in this illustrative embodiment comprises the upper FBAR of the CRF 100.

The first and second bridges 110, 104 are formed by patterning a sacrificial material over the first piezoelectric layer 108 and the second piezoelectric layer 114, and forming the depicted layers thereover. After the layers of the CRF 100 are formed as desired, the sacrificial material is released leaving the first and second bridges 110, 104 "filled" with air. In a representative embodiment, the sacrificial material used to form the first and second bridges 110, 104 is the same as the sacrificial material used to form the acoustic reflector 120 (e.g., PSG). In the representative embodiment shown and described in connection with FIG. 1D, the first and second bridges 110, 104 were unfilled (i.e., contained air as the acoustic medium). As described in the parent application, one or both of first and second bridges 110, 104 are filled with a material to provide the acoustic impedance discontinuity to reduce losses.

In a representative embodiment, the first bridge 110 and the second bridge 104 provide a perimeter around an active region of the CRF 100. The active region thus includes the portions of the first BAW resonator, the second BAW resonator, the coupling layer 112 disposed over the acoustic reflector 120 (or other acoustic reflector), and bounded by the perimeter provided by the first bridge 110 and the second bridge 104. As should be appreciated by one of ordinary skill in the art, the active region of the CRF 100 is bordered around its perimeter by an acoustic impedance discontinuity created at least in part by the first and second bridges 110, 104, and above and below (acoustic reflector 120) by an acoustic impedance discontinuity. Thus, a resonant cavity is beneficially provided in the active region of the CRF 100. In certain embodiments, the first bridge 110 and the second bridge 104 are unfilled (i.e., contain air), as is the acoustic reflector 120. In other embodiments described more fully below, the first bridge 110, the second bridge 104, or both, are filled with a material to provide the desired acoustic impedance discontinuity.

It is noted that the first bridge 110, or the second bridge 104, or both, do not necessarily have to extend along all edges of the CRF 100, and therefore not along the entire perimeter of the CRF 100. For example, the first bridge 110 or the second bridge 104, or both, may be provided on four "sides" of the five-sided CRF 100 shown in FIG. 1A. In certain embodiments, the first bridge 110 is disposed along the same four sides of the CRF, for example, as the second bridge 104. In other embodiments, the first bridge 110 is disposed along four sides (e.g., all sides but the connection side 102) of the CRF 100 and the second bridge 104 is disposed along four sides of the CRF 100, but not the same four sides as the first bridge 110 (e.g., second bridge 104 is disposed along the connection side 102).

An inner raised region 116 is provided over the second upper electrode 101 in the depicted representative embodiment. Certain aspects of the inner raised region 116 are described in commonly owned U.S. patent application Ser. No. 13/074,094, entitled "Stacked Bulk Acoustic Resonator and Method of Making the Same" filed on Mar. 29, 2011, to Dariusz Burak, et al. The entire disclosure of U.S. patent application Ser. No. 13/074,094 is specifically incorporated herein by reference.

The inner raised region 116 is formed in an inner portion of the second upper electrode 101, for example, substantially in the geometric center of the second upper electrode 101. The inner raised region 116 is separated by a distance 117 from the edge of the active region of the CRF 100. The distance 117 as well as the thickness (y-dimension in the depicted coordinate system) of an inner raised region 116 determine how strongly the unwanted modes for frequencies below series resonance frequency Fs of a given mode (that is odd mode or an even mode) get suppressed. In a non-limiting illustrative configuration, the distance 117 may be approximately 1 µm to 10 µm, depending on a required operating frequency range and the selected materials that comprise the CRF 100. Generally, application of the inner raised region 116 shifts the resonant frequency ("cut-off frequency") of the corresponding region of CRF 100, and otherwise improves operation of the CRF 100, for example, by providing suppression of unwanted lateral modes for frequencies below series resonance frequency Fs. An increase in thickness of the inner raised region 116 causes the resonant frequency of the CRF 100 to shift lower, and conversely a decrease in the thickness of the inner raised region 116 causes the resonant frequency to shift higher. In a non-limiting illustrative configuration, the inner raised region 116 may be approximately 50 Å to approximately 500 Å in thickness. If the distance 117 is too narrow or the thickness of an inner raised region 116 is too small, the degree of suppression of unwanted modes is negligible. If the distance 117 is too wide or the thickness of an inner raised region 116 is too large, the spectral performance above series resonance frequency deteriorates making such configuration impractical. Thus the optimum distance 117 and the thickness of the inner raised region 116 may be found experimentally. The inner raised region 116 may be an additional thin layer of material or a protrusion from the second upper electrode 101 as described in U.S. patent application Ser. No. 13/074,094. Notably, the CRF 100 may be apodized or irregular in shape, where the inner raised region 116 may be of the same shape. As such, the inner raised region 116 has an outer perimeter that follows the outer perimeter of the second upper electrode 101. Of course, the CRF 100 may be formed in alternative shapes, such as circular, square, rectangular, trapezoidal, etc., without departing from the scope of the present teachings. The inner raised region 116 has substantially the same shape as the CRF 100. However, in various embodiments, the inner raised region 116 may be shaped differently from one another and/or from the CRF 100.

The inner raised region 116 may be formed of electrically conductive materials, such as W, Mo or Cu, for example, and may be the same material as the second upper electrode 101. Alternatively, the inner raised region 116 may be formed of different materials than the second upper electrode 101. Also, inner raised regions 116 may be formed of a dielectric material, such as silicon dioxide (SiO$_2$), silicon nitride (SiN), silicon carbide (SiC), AlN, ZnO or PZT, for example. In alternative embodiments the inner raised region 116 may be formed on layers other than the second upper electrode 101. Notably inner raised region 116 can be formed on first lower electrode 107, first upper electrode 111, or second lower electrode 113, or on a plurality of the first lower electrode 107, the first upper electrode 111, the second lower electrode 113 and the second upper electrode 101. It should be pointed out that any such alternative placement of inner raised region 116 increases complexity of the fabrication of CRF 100, but it may yield an improved device performance.

In conjunction with the first and second bridges 110, 104, the inner raised region 116 provides an the acoustic impedance mismatch that causes reflection and suppression of acoustic waves at the boundary that may otherwise excite unwanted acoustic modes that can propagate out of the active region and be lost, resulting in energy loss. The first bridge 110, the second bridge 104 and the inner raised region 116 serve to confine the modes of interest within the active region of the CRF 100 and reduce energy losses in the CRF. Reducing such losses serves to increase the Q-factor of the modes ($Q_o$ and $Q_e$) of interest in the CRF 100, and improve insertion loss over the passband of the CRF 100.

Figure 2A:
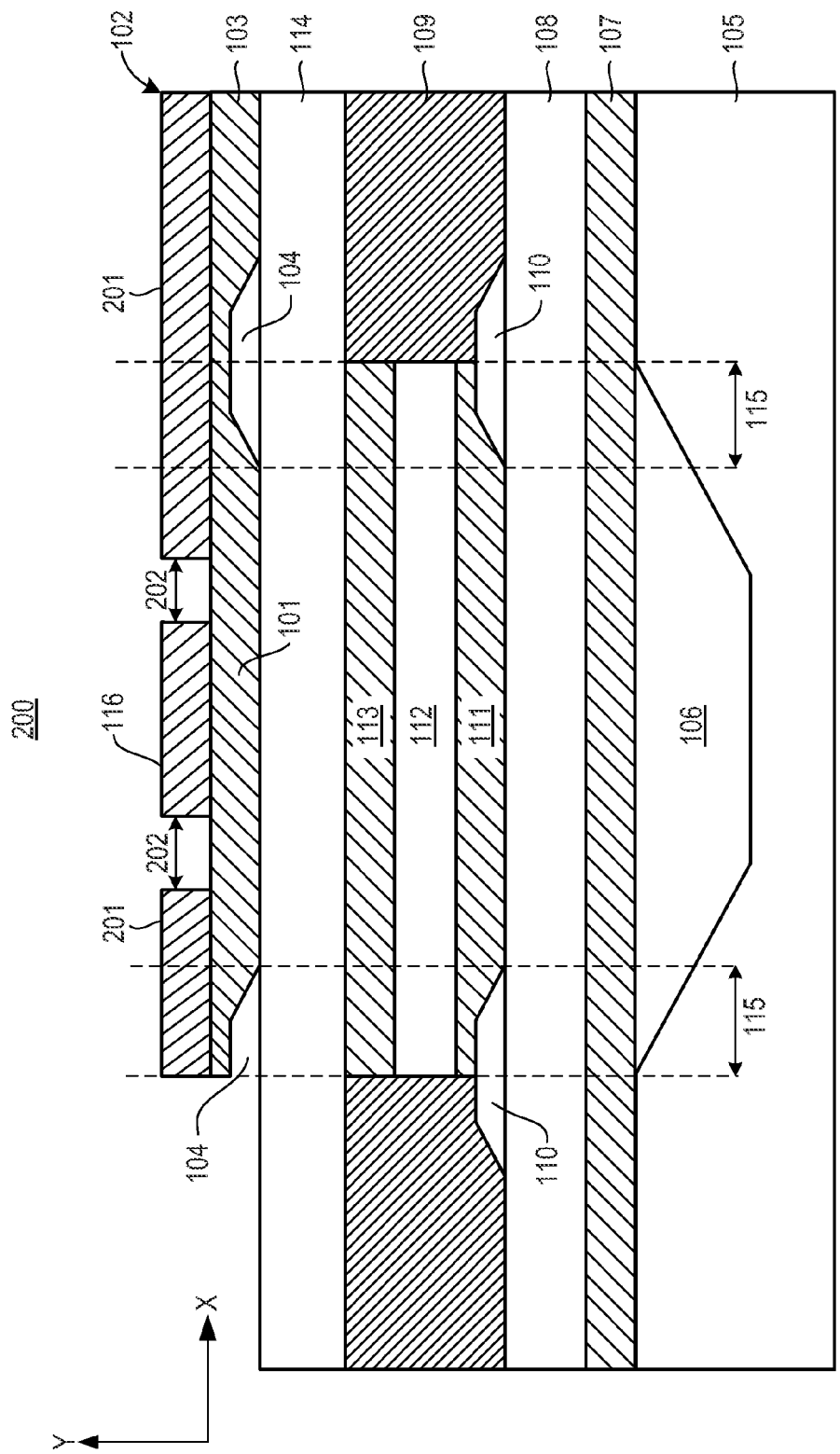
FIG. 2A is a cross-sectional view of a CRF in accordance with a representative embodiment.

FIG. 2A shows a cross-sectional view of the CRF 200 in accordance with a representative embodiment. Many aspects of the CRF 200 are common to the description of CRF 100 depicted in FIG. 1B and, accordingly, are not repeated.

CRF 200 comprises inner raised region 116 and an outer raised region 201 formed on the top surface of the second upper electrode 101. The inner raised region 116 is formed in an inner portion of the second upper electrode 101, for example, substantially in the center of the second upper electrode 101. The inner raised region 116 may be an additional thin layer of material or a protrusion from the second upper electrode 101. The outer raised region 201 is formed around an outer perimeter of the second upper electrode 101. Similar to the inner raised region 116, the outer raised region 201 may be an additional thin layer of material or a protrusion from the second upper electrode 101. The inner and outer raised regions 116 and 201 define a gap 202 between them. For example, the CRF 200 may be apodized or irregular in shape, where the inner raised region 116 is surrounded by the gap 202, and the gap 202 is surrounded by the outer raised region 201, which follows the outer perimeter of the second upper electrode 101. Of course, CRF 200 may be formed in alternative shapes, such as circular, square, rectangular, trapezoidal, etc., without departing from the scope of the present teachings. The inner raised region 116 and the outer raised region 201 have substantially the same shape as the CRF 200 in the representative embodiment. However, in various embodiments, the inner raised region 116 and the outer raised region 201 may be shaped differently from one another and/or from the CRF 200.

The inner and outer raised regions 116 and 201 may be formed of electrically conductive materials, such as W, Mo or Cu, for example, and may be the same material as the second upper electrode 101. Alternatively, the inner and outer raised regions 116 and 201 may be formed of different materials than the second upper electrode 101 and/or different material from one another. Also, one or both of the inner and outer raised regions 116 and 201 may be formed of a dielectric material, such as silicon dioxide (SiO$_2$), silicon nitride (SiN), silicon carbide (SiC), AlN, ZnO or PZT, for example. In the illustrative configuration depicted in FIG. 2A, the inner raised region 116 is thinner than the outer raised region 201. However, in alternative configurations, the inner raised region 116 may be thicker than the outer raised region 201, or the inner raised region 116 and the outer raised region 201 may have the same thickness. In alternative embodiments the inner raised region 116 and the outer raised region 201 may be formed on layers other than the second upper electrode 101. Notably, inner raised region 116 and outer raised region 201 may be formed on first lower electrode 107, first upper electrode 111, second lower electrode 113, or on a plurality of the first lower electrode 107, the first upper electrode 111, the second lower electrode 113 and the second upper electrode 101. It should be pointed out that any such alternative placement of inner raised region 116 and the outer raised region 201 increases complexity of the fabrication of CRF 200, but it may yield an improved device performance.

The thicknesses of the inner raised region 116 and the outer raised region 201 may vary to provide unique benefits for any particular situation or to meet application specific design requirements of various implementations. Generally, application of the inner and outer raised regions 116 and 201 shifts the resonant frequency ("cut-off frequency") of the corresponding region of CRF 200, and otherwise improves operation of the CRF 200, for example, by providing boundary conditions that reflect and suppress propagating eigenmodes. An increase in thickness of the inner raised region 116 causes the resonant frequency of the CRF 200 to shift lower, and conversely a decrease in the thickness of the inner raised region 116 causes the resonant frequency of the CRF 200 to shift higher. Likewise, an increase in thickness of the outer raised region 201 causes the resonant frequency of the CRF 200 to shift lower, and a decrease in the thickness of the outer raised region 201 causes the resonant frequency of the CRF 200 to shift higher. In an illustrative embodiment, the thickness of the outer raised region 201 may be approximately twice the thickness of the inner raised region 116. Also, in a non-limiting illustrative configuration, and depending on the material selected, the inner raised region 116 may be approximately 50 Å to approximately 1000 Å in thickness, and the outer raised region 201 may be approximately 100 Å to approximately 5000 Å in thickness. Notably, materials having a lower acoustic impedance (e.g., dielectric materials) are provided to a thickness of approximately 100 Å to approximately 700 Å.

The gap 202 is arranged between and otherwise defined by the inner and outer raised regions 116 and 201, and generally varies inverse-proportionately to the thickness of the inner raised region 116. That is, an increased thickness of the inner raised region 116 requires a smaller gap 202. For example, in a non-limiting illustrative configuration, the gap 202 may have a width of approximately 1 μm to approximately 8 μm for the illustrative range of the inner raised region 116 mentioned above. The arrangement of the inner and outer raised regions 116 and 201 and the gap 202 are therefore able to modify of the boundary conditions for some of lateral modes excited in CRF 200. This modification of the boundary acoustical conditions significantly reduces and/or suppresses excitation of unwanted propagating lateral modes in the region outside of the active region of CRF 200, which results improvement of the quality (Q) factor and insertion loss ($S_{21}$) of the CRF 200 discussed below in connection with FIG. 2B.

Although FIG. 2A depicts the gap 202 formed between the inner and outer raised regions 116 and 201 as having a relatively uniform size, in alternative embodiments, the inner and outer raised regions 116 and 201 may have different geometries or shapes, in which case the size of the gap 202 would vary depending on corresponding spaces between the inner and outer raised regions 116 and 201. Also, in alternative embodiments described in connection with FIGS. 1B and 3A, only the inner raised region 116 or the outer raised region 201 is formed on the surface of the second upper electrode 101, in which case there is no gap 202.

In conjunction with the first and second bridges 110, 104, the inner raised region 116 and the outer raised region 201 provide an acoustic impedance mismatch which causes reflection of acoustic waves at the respective boundaries that may otherwise propagate out of the active region and be lost, resulting in energy loss. The first and second bridges 110, 104 and the inner and outer raised regions 116, 201 serve to confine the modes of interest within the active region of the CRF 200 and reduce energy losses in the CRF 200. Reducing such losses serves to increase the Q-factor of the modes ($Q_o$ and $Q_e$) of interest in the CRF 100, and improve insertion loss over the passband of the CRF 200.

Figure 2B:
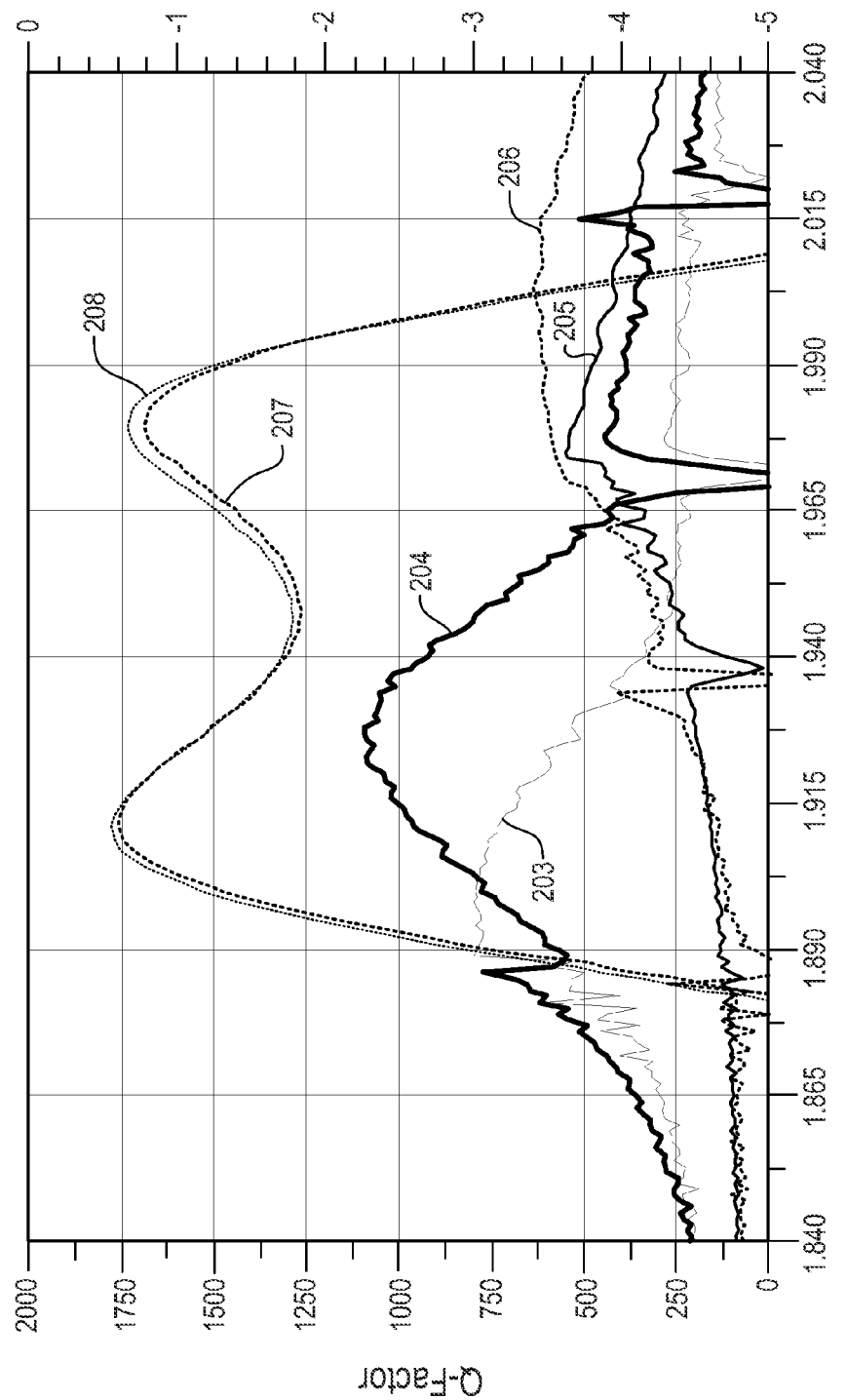
FIG. 2B is a graphical representation of the insertion loss ($S_{21}$ in dB) and the Q factors of odd and even modes ($Q_o$ and $Q_e$) of a known CRF and a CRF in accordance with a representative embodiment.

FIG. 2B is a graphical representation of the Q-factor (left vertical axis) versus frequency and insertion loss ($S_{21}$) (right axis) versus frequency for CRF 200 described in connection with FIG. 2A above. As described presently, FIG. 2B shows a comparison of measured insertion loss ($S_{21}$), the odd mode Q ($Q_o$) and the even mode Q ($Q_e$) of a known CRF with those of CRF 100 of a representative embodiment.

Curve 203 depicts $Q_o$ of a known CRF and curve 204 depicts $Q_o$ of CRF 200 of the representative embodiment described in connection with FIG. 2A. Compared to the known CRF, an improvement of $Q_o$ up to 100% (depending on frequency of operation, e.g. at 1.915 GHz) is realized due to the increased confinement of an odd mode in the CRF 200 by use of first and second bridges 110, 104 and inner raised and outer raised regions 116, 201 of the representative embodiment.

Curve 205 depicts $Q_e$ of a mode in a known CRF and curve 206 depicts $Q_e$ of a mode in CRF 200. Compared to a known CRF, an improvement of $Q_e$ up to 50% (depending on frequency of operation, e.g. at 1.99 GHz) is realized due to the increased confinement of an even mode in the CRF 200 by use of first and second bridges 110, 104 and inner and outer raised regions 116, 201 of the representative embodiment.

Curve 207 shows the insertion loss of a known CRF over the frequency range of approximately 1.89 GHz to approximately 1.99 GHz. Curve 208 shows the insertion loss of CRF 200. Compared to a known CRF, an improvement of approximately 0.1 dB to approximately 0.2 dB (depending on frequency of operation, e. g. at 1.914 GHz and 1.98 GHz) is realized due to increased confinement of both odd and even modes in the CRF 200 by incorporation of first and second bridges 110, 104 and inner raised and outer raised regions 116, 201 of the representative embodiment.

Figure 3A:
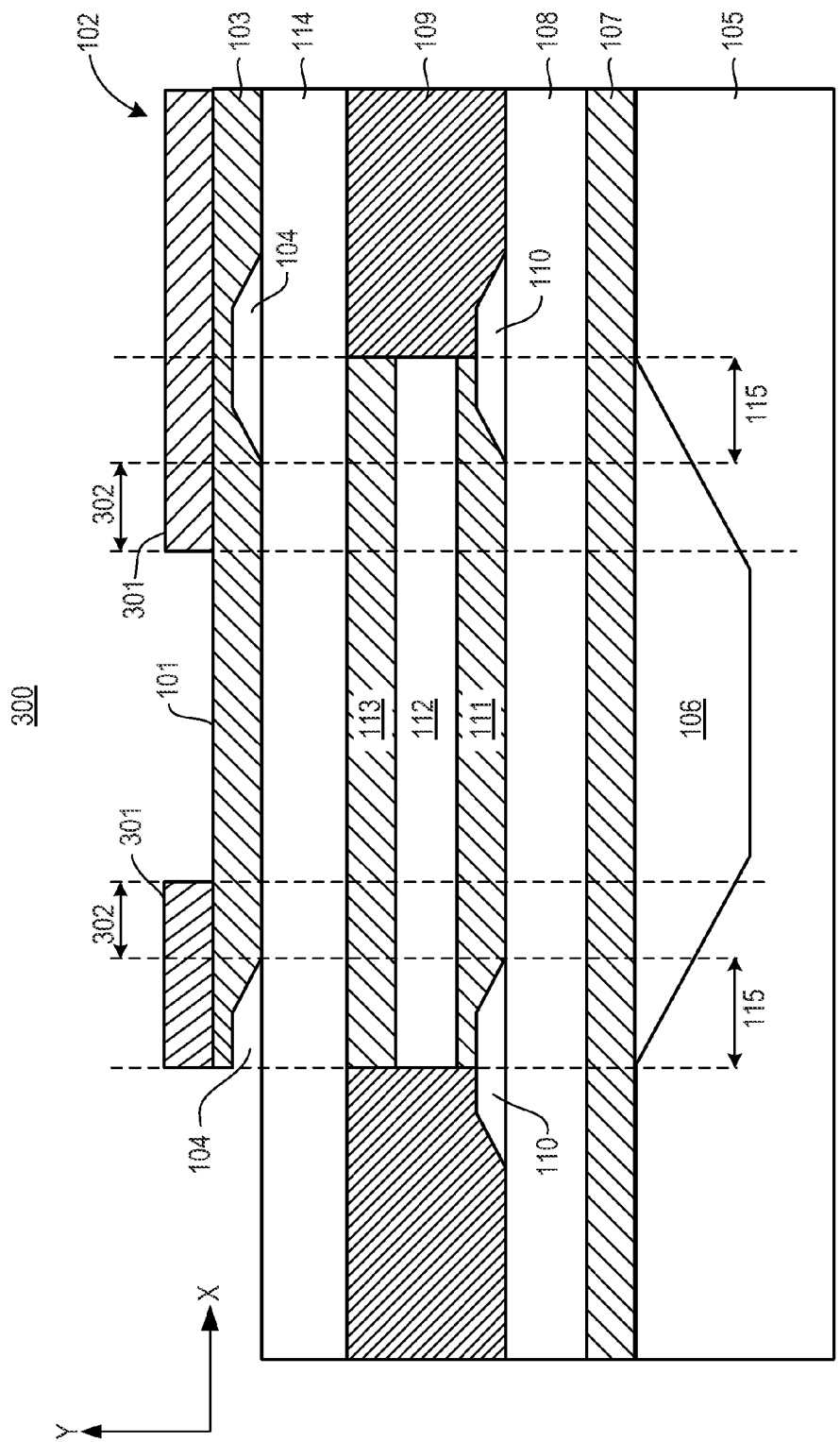
FIG. 3A is a cross-sectional view of a CRF in accordance with a representative embodiment.

FIG. 3A shows a cross-sectional view of the CRF 300 in accordance with a representative embodiment. Many aspects of the CRF 300 are common to the description of CRFs 100, 200 depicted in FIGS. 1B, 2A and, accordingly, are not repeated.

CRF 300 comprises an outer raised region 301 formed on the top surface of the second upper electrode 101. The outer raised region 301 is formed around an outer perimeter of the second upper electrode 101. Outer raised region 301 may be an additional thin layer of material or a protrusion from the second upper electrode 101. As noted above, the portions of the first BAW resonator, the second BAW resonator, and the coupling layer 112 disposed over the cavity 106 (or other acoustic reflector), which are bounded by the perimeter provided by the first bridge 110 and the second bridge 104, comprise the active region of CRF 300. In the active region of the CRF 300 an overlap 302 of the outer raised region 301 is provided. For example, the CRF 300 may be apodized or irregular in shape, and the outer raised region (and overlap 302) follows the outer perimeter of the second upper electrode 101. CRF 300 may be formed in alternative shapes, such as circular, square, rectangular, trapezoidal, etc., without departing from the scope of the present teachings. The outer raised region 301 has substantially the same shape as the CRF 300 in the representative embodiment. However, in various embodiments, the outer raised region 301 may be shaped differently from the CRF 300.

The outer raised region 301 may be formed of electrically conductive materials, such as W, Mo or Cu, for example, and may be the same material as the second upper electrode 101. Alternatively, the outer raised region 301 may be formed of different materials than the second upper electrode 101. Also, the outer raised region 301 may be formed of a dielectric material, such as silicon dioxide ($SiO_2$), silicon nitride (SiN), silicon carbide (SiC), AlN, ZnO or PZT, for example. In alternative embodiments the outer raised region 301 may be formed on layers other than the second upper electrode 101. Notably, outer raised region 301 can be formed on first lower electrode 107, first upper electrode 111, second lower electrode 113, or on a plurality of the first lower electrode 107, the first upper electrode 111, the second lower electrode 113 and the second upper electrode 101. It should be pointed out that any such alternative placement of outer raised region 301 increases complexity of the fabrication of CRF 300, but it may yield an improved device performance.

The thickness of the outer raised region 301 may vary to provide unique benefits for any particular situation or to meet application specific design requirements of various implementations. Generally, application of the outer raised region 301 shifts the resonant frequency ("cut-off frequency") of the corresponding region of CRF 300, and otherwise improves operation of the CRF 300. An increase in thickness of the outer raised region 301 causes the resonant frequency of the CRF 300 to shift lower, and a decrease in the thickness of the outer raised region 301 causes the resonant frequency to shift higher. Also, in a non-limiting illustrative configuration, and depending on the material selected, the inner raised region 116 may be approximately 50 Å to approximately 1000 Å in thickness, and the outer raised region 201 may be approximately 100 Å to approximately 5000 Å in thickness. Notably, materials having a lower acoustic impedance (e.g., dielectric materials) are provided to a thickness of approximately 100 Å to approximately 700 Å.

The width of the overlap 302 (i.e., the area of overlap of the outer raised region 301 with the active area of the CRF 300) generally varies inverse-proportionately to the thickness of the outer raised region 301. That is, an increased thickness (y-dimension) of the region 301 requires a smaller width (x-dimension) of the overlap 302. For example, in a non-limiting illustrative configuration, the overlap 302 may have a width of approximately 1 µm to approximately 10 µm for the illustrative range of the thickness of the outer raised region 301 mentioned above. The arrangement of the outer raised region 301 is therefore able to modify the acoustical boundary conditions of the CRF 300. This modification of the acoustical boundary conditions significantly reduces and/or suppresses excitation of acoustic lateral modes in the outside region of the CRF, which results in improvement of the quality (Q) factor and insertion loss ($S_{21}$) of the CRF 300 discussed below in connection with FIG. 3B.

In conjunction with the first and second bridges 110, 104, the inner raised region 301 provides an acoustic impedance mismatch which causes reflection of acoustic waves at the respective boundaries that may otherwise excite propagating waves outside of the active region and be lost, resulting in energy loss. The first and second bridges 110, 104 and the outer raised region 301 serve to confine the modes of interest within the active region of the CRF 300 and reduce energy losses in the CRF. Reducing such losses serves to increase the Q-factor of the modes ($Q_o$ and $Q_e$) of interest in the CRF 300, and improve insertion loss over the passband of the CRF 300.

Figure 3B:
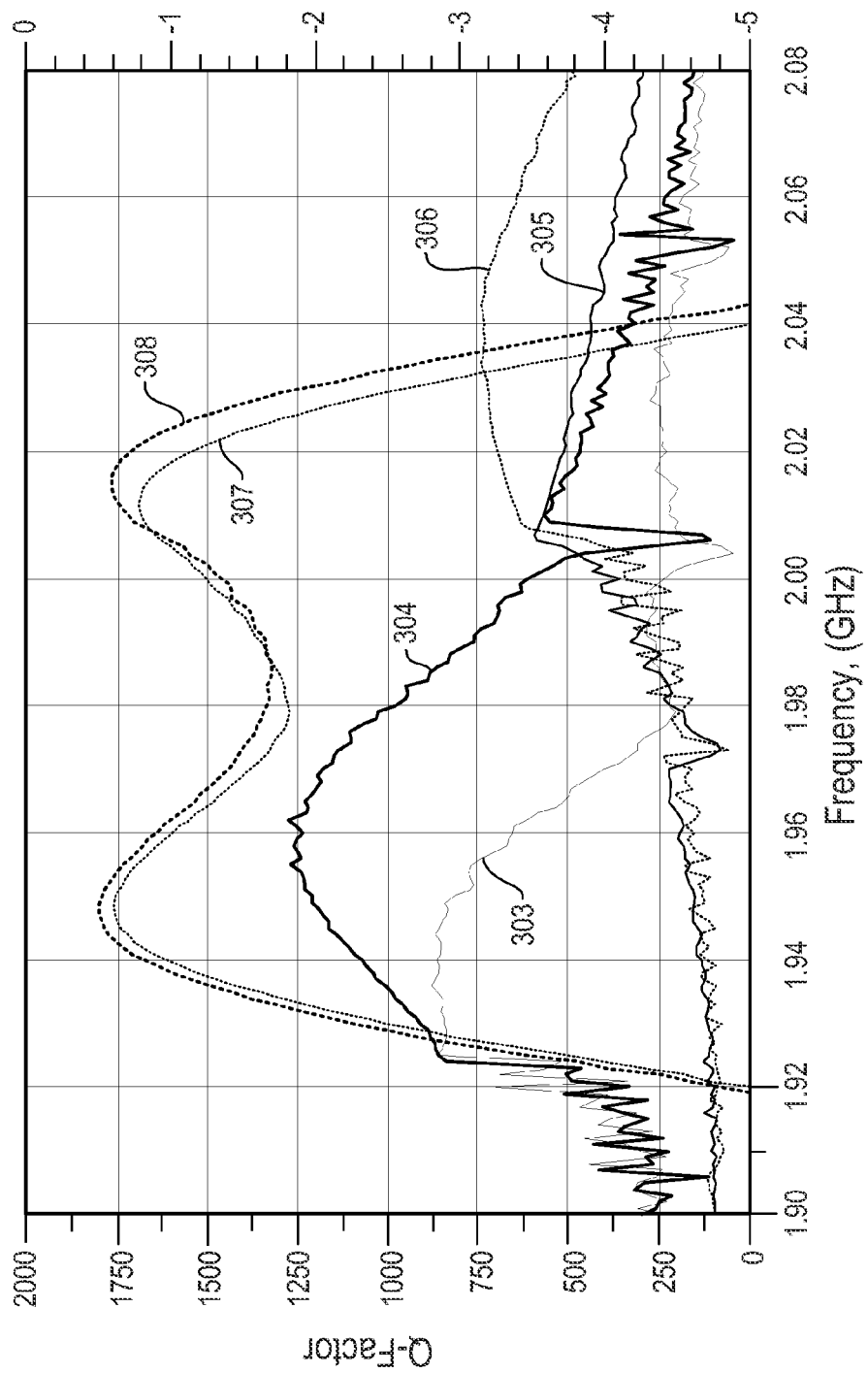
FIG. 3B is a graphical representation of the insertion loss ($S_{21}$ in dB) and the Q factors of odd and even modes ($Q_o$ and $Q_e$) of a known CRF and a CRF in accordance with a representative embodiment.

FIG. 3B is a graphical representation of the Q-factor (left vertical axis) versus frequency and insertion loss ($S_{21}$) (right axis) versus frequency for CRF 300 described in connection with FIG. 3A above. As described presently, FIG. 3B shows a comparison of measured insertion loss ($S_{21}$), the odd mode Q ($Q_o$) and the even mode Q ($Q_e$) of a known CRF with those of CRF 100 of a representative embodiment.

Curve 303 depicts $Q_o$ of a known CRF and curve 304 depicts $Q_o$ of CRF 300 of the representative embodiment described in connection with FIG. 3A. Compared to the known CRF, an improvement of $Q_o$ up to 80% (depending on frequency of operation, e.g. at 1.96 GHz) is realized due to the increased confinement of an odd mode in the CRF 300 by use of first and second bridges 110, 104 and outer raised region 301 of the representative embodiment.

Curve 305 depicts $Q_e$ of a mode in a known CRF and curve 306 depicts $Q_e$ of a mode in CRF 300. Compared to a known CRF, an improvement of $Q_e$ up to 50% (depending on frequency of operation, e.g. at 2.02 GHz) is realized due to the increased confinement of an odd mode in the CRF 300 by use of first and second bridges 110, 104 and outer raised region 301 of the representative embodiment.

Curve 307 shows the insertion loss of a known CRF over the frequency range of approximately 1.89 GHz to approximately 1.99 GHz. Curve 308 shows the insertion loss of CRF 200. Compared to a known CRF, an improvement of insertion loss approximately 0.1 dB to approximately 0.3 dB (depending on frequency of operation, e.g. at 1.94 GHz and 2.02 GHz) is realized due to the increased confinement of an odd mode in the CRF 300 by use of first and second bridges 110, 104 and outer raised region 301 of the representative embodiment.

In accordance with illustrative embodiments, BAW resonator structures and their methods of fabrication are described. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

The invention claimed is:

1. A bulk acoustic wave (BAW) resonator structure, comprising:
    a first BAW resonator comprising a first lower electrode, a first upper electrode and a first piezoelectric layer disposed between the first lower electrode and the first upper electrode;
    a second BAW resonator comprising a second lower electrode, a second upper electrode and a second piezoelectric layer disposed between the second lower electrode and the second upper electrode;
    an acoustic coupling layer disposed between the first BAW resonator and the second BAW resonator;
    a bridge disposed between the first lower electrode of the first BAW resonator and the second upper electrode of the second BAW resonator;
    an inner raised region disposed over the second upper electrode and at an inner portion of the second upper electrode, wherein the inner raised region comprises an electrically conductive material and
    an outer raised region disposed over the second upper electrode, the outer raised region comprising a conductive material.

2. A BAW resonator structure as claimed in claim 1 further comprising a gap defined between the inner raised region and the outer raised region.

3. A BAW resonator structure as claimed in claim 2, wherein the gap has a width of approximately 1 µm to approximately 10 µm.

4. A BAW resonator structure as claimed in claim 1, wherein the conductive material of the inner raised region and the outer raised region is the same as a conductive material of the first lower electrode, the first upper electrode, the second lower electrode or the second upper electrode.

5. A BAW resonator structure as claimed in claim 1, wherein the conductive material of the inner raised region and the outer raised region comprises one of tungsten (W), molybdenum (Mo) and copper (Cu).

6. A BAW resonator structure as claimed in claim 1, wherein the inner raised region has a thickness of about 50 Å to about 500 Å, and the outer raised region has a thickness of approximately 500 Å to approximately 5000 Å.

7. A BAW resonator structure as claimed in claim 1, wherein the BAW resonator structure has a first perimeter bounding an active region of the BAW resonator structure, the bridge is disposed along the first perimeter, and the inner raised region is disposed over the active region.

8. A BAW resonator structure as claimed in claim 1, wherein the BAW resonator has a-perimeter, and the bridge is disposed along the perimeter.

9. A BAW resonator structure as claimed in claim 1, further comprising a fill material disposed in the bridge.

10. A BAW resonator structure as claimed in claim 1, wherein the bridge has a trapezoidal cross-sectional shape.

11. A BAW resonator structure as claimed in claim 1, wherein the first BAW resonator comprises a first film bulk acoustic wave resonator (FBAR) and the second BAW resonator comprises a second FBAR.

12. A BAW resonator structure as claimed in claim 1, wherein the BAW resonator structure comprises a solidly mounted resonator (SMR).

13. A BAW resonator structure as claimed in claim 1, wherein the inner portion of the second upper electrode is disposed at substantially a geometric center of the second upper electrode.

14. A bulk acoustic wave (BAW) resonator structure, comprising:
a first BAW resonator comprising a first lower electrode, a first upper electrode and a first piezoelectric layer disposed between the first lower electrode and the first upper electrode;
a second BAW resonator comprising a second lower electrode, a second upper electrode and a second piezoelectric layer disposed between the second lower electrode and the second upper electrode;
an acoustic coupling layer disposed between the first BAW resonator and the second BAW resonator;
a bridge disposed between the first lower electrode of the first BAW resonator and the second upper electrode of the second BAW resonator;
an outer raised region disposed over the second upper electrode; and
an inner raised region having a thickness, wherein a gap exists between the inner raised region and the outer raised region, the gap having a width that is selected to be inversely proportional to the thickness of the inner raised region.

15. A BAW resonator structure as claimed in claim 14, wherein the outer raised region comprises a conductive material.

16. A BAW resonator structure as claimed in claim 15, wherein the conductive material of the outer raised region is the same as a conductive material of the first lower electrode, the first upper electrode, the second lower electrode or the second upper electrode.

17. A BAW resonator structure as claimed in claim 15, wherein the conductive material of the outer raised region comprises one of tungsten (W), molybdenum (Mo) and copper (Cu).

18. A BAW resonator structure as claimed in claim 14, wherein the outer raised region comprises a dielectric material.

19. A BAW resonator structure as claimed in claim 18, wherein the dielectric material of the outer raised region comprises one of silicon dioxide (SiO$_2$), silicon nitride (SiN), silicon carbide (SiC), zinc oxide (ZnO), aluminum nitride (AlN) and lead zirconium titanate (PZT).

20. A BAW resonator structure as claimed in claim 14, wherein the outer raised region has a thickness of approximately 500 Å to approximately 5000 Å.

21. A BAW resonator structure as claimed in claim 14, wherein the BAW resonator structure has a perimeter bounding an active region of the BAW resonator structure, the bridge is disposed along the perimeter, and the outer raised region overlaps a portion of the active region.

22. A bulk acoustic wave (BAW) resonator structure, comprising:
a first BAW resonator comprising a first lower electrode, a first upper electrode and a first piezoelectric layer disposed between the first lower electrode and the first upper electrode;
a second BAW resonator comprising a second lower electrode, a second upper electrode and a second piezoelectric layer disposed between the second lower electrode and the second upper electrode;
an acoustic coupling layer disposed between the first BAW resonator and the second BAW resonator;
a first bridge disposed between the first lower electrode of the first BAW resonator and the second upper electrode of the second BAW resonator;
a second bridge disposed between the first upper electrode of the first BAW resonator and the second lower electrode of the second BAW resonator; and
an inner raised region disposed over the second upper electrode.

23. A BAW resonator structure as claimed in claim 22, further comprising a fill material disposed in the first bridge.

24. A BAW resonator structure as claimed in claim 22, further comprising a fill material disposed in the second bridge.

25. A BAW resonator as claimed in claim 22, wherein the inner raised region is disposed substantially at a geometric center of the second upper electrode.

26. A BAW resonator structure as claimed in claim 22, further comprising an outer raised region disposed over the second upper electrode.

27. A BAW resonator structure as claimed in claim 26, further comprising a gap defined between the inner raised region and the outer raised region.

28. A BAW resonator structure as claimed in claim 27, wherein the gap has a width of approximately 1 µm to approximately 10 µm.

29. A BAW resonator structure as claimed in claim 26, wherein each of the inner raised region and the outer raised region comprises a conductive material.

30. A BAW resonator structure as claimed in claim 29, wherein the conductive material of the inner raised region and the outer raised region is the same as a conductive material of the first lower electrode, the first upper electrode, the second lower electrode or the second upper electrode.

31. A BAW resonator structure as claimed in claim 29, wherein the conductive material of the inner raised region and the outer raised region comprises one of tungsten (W), molybdenum (Mo) and copper (Cu).

32. A BAW resonator structure as claimed in claim 26, wherein each of the inner raised region and the outer raised region comprises a dielectric material.

33. A BAW resonator structure as claimed in claim 32, wherein the dielectric material of the inner raised region and the outer raised region comprises one of silicon dioxide (SiO$_2$), silicon nitride (SiN), silicon carbide (SiC), zinc oxide (ZnO), aluminum nitride (AlN) and lead zirconium titanate (PZT).

34. A BAW resonator structure as claimed in claim 26, wherein the inner raised region has a thickness of about 50 Å to about 500 Å, and the outer raised region has a thickness of approximately 500 Å to approximately 5000 Å.

* * * * *